United States Patent [19]
Oda et al.

[11] Patent Number: 5,490,117
[45] Date of Patent: Feb. 6, 1996

[54] IC CARD WITH DUAL LEVEL POWER SUPPLY INTERFACE AND METHOD FOR OPERATING THE IC CARD

[75] Inventors: Zenzo Oda; Noriaki Sakurada, both of Suwa, Japan

[73] Assignee: Seiko Epson Corporation, Tokyo, Japan

[21] Appl. No.: 216,272

[22] Filed: Mar. 23, 1994

[30] Foreign Application Priority Data

Mar. 23, 1993 [JP] Japan .................................. 5-064347
Dec. 28, 1993 [JP] Japan .................................. 5-353820

[51] Int. Cl.⁶ .......................... G11C 13/00; G11C 14/00
[52] U.S. Cl. .................... 365/226; 365/189.01; 365/228; 365/229
[58] Field of Search .................... 365/226, 227, 365/228, 229, 189.01; 235/492

[56] References Cited

U.S. PATENT DOCUMENTS

| | | | |
|---|---|---|---|
| 5,016,223 | 5/1991 | Kimura | 365/229 |
| 5,138,142 | 8/1992 | Sanemitsu | 235/492 |
| 5,245,582 | 9/1993 | Kimura | 365/229 |
| 5,329,491 | 7/1994 | Brown | 365/226 |

FOREIGN PATENT DOCUMENTS 2-259853  10/1990  Japan .
4-30208   2/1992  Japan .

*Primary Examiner*—David C. Nelms
*Assistant Examiner*—Son Mai
*Attorney, Agent, or Firm*—Oliff & Berridge

[57] ABSTRACT

An objective of the present invention is to provide a highly reliable IC card which is large in the scale of integration, fast, and low power-consuming, which contains the latest type of IC that has an operating voltage of 3.3 V and a maximum rated voltage of 5 V or less, and which can be used in either the latest equipment rated at 3.3 V or existing equipment rated at 5 V, or which does not cause this latest type of IC to be destroyed. The interface circuit comprises an analog switch, an external interface circuit, an interval interface circuit, and a high-voltage detection circuit. If the voltage of the power supply Vcc of the host system is less than or equal to an upper-limit voltage of 4 V, the power supply voltage is applied unchanged through the analog switch to a ROM that is the main circuit. On the other hand, if the power supply voltage is greater than this upper-limit voltage of 4 V, the analog switch is made non-conductive and thus the power supply voltage is not applied to the ROM. This prevents the ROM from being destroyed. If a regulated-voltage circuit is also provided, a power supply voltage regulated at 3.3 V can be applied to the ROM, even when the power supply voltage of host system is greater than the upper-limit voltage of 4 V.

36 Claims, 15 Drawing Sheets

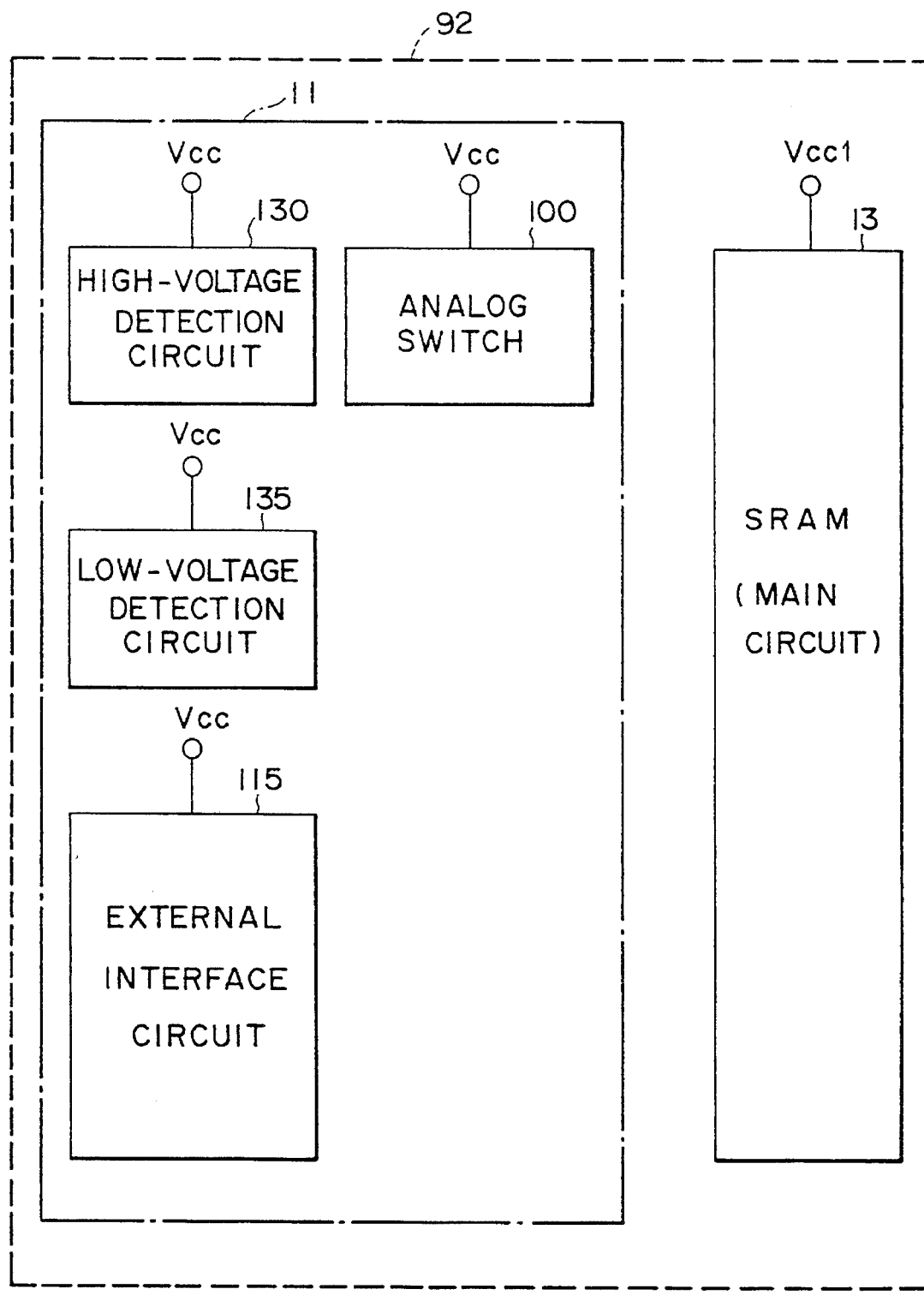

IC CARD WITH DUAL LEVEL POWER SUPPLY INTERFACE AND METHOD FOR OPERATING THE IC CARD

BACKGROUND OF THE INVENTION

1. Field of the Invention

The present invention relates to an IC card.

2. Related Art

A storage device called an IC card has long been known as a card storage device which comprises integrated circuits. Known types of IC card include memory cards, I/O cards, and ISO standard IC cards. In this case, an ISO standard IC card is an IC card which comprises a microprocessor and memory among its integrated circuits, and which, since it can be given a security function, is used widely in fields such as medical and financial applications. A memory card is an IC card that comprises only memory among its integrated circuits (it has no microprocessor) and is used widely as a portable storage device in applications such as personal computers, electronic musical instruments, and games machines. Many different types of memory card are known, defined by memory type as SRAM cards, DRAM cards, mask ROM cards, EPROM cards, OTPROM cards, EEPROM cards, flash EEPROM cards, as well as cards that use mixtures of these types of memory. An I/O card is an IC card that has many functions such as modem, LAN, or Ethernet functions, and is used widely as a removable input-output device in devices such as personal computers. International standards for memory cards and I/O cards are defined by cooperation between the Japan Electronics Industry Development Association (JEIDA) and the US Personal Computer Memory Card International Association (PCMCIA). For details, refer to: IC Memory Card Guidelines (specifications for IC memory card for personal computers) JEIDA, published September 1991.

An IC card of this type is used by being inserted into a card slot provided in an electronic device such as a personal computer or ATM installation (hereinafter called the host system). The explanation below concerns memory cards.

A block diagram of a prior art read-only memory (ROM) card is shown in FIG. 14. Among the components provided on the card are a connector 2, an interface circuit 10, and a number of ROM units 12 that form a main circuit. In this case, the connector 2 is used to connect to the card slot of the host system when the card is in use, and it has terminals for the power supply, control signals 30 and 31, address signals 40, and data signals 50. The interface circuit 10 is provided between the connector 2 and the ROM 12 that is the main circuit, and it includes components such as a decoder circuit and an output circuit that are not shown in the figure. A selection signal is generated by this decoder circuit from the control signals 30 and 31 and the address signals 40 from the host system, and this selection signal is supplied to the ROM 12. In addition, data is output from the ROM 12. In this case, both the ROM 12 and the interface circuit 10 operate at 5 Volts (hereinafter, "Volt" is abbreviated to "V"). Therefore, power for the ROM 12 and the interface circuit 10 is supplied by an external power line 20 connected to a 5 V power terminal of the connector 2.

A block diagram of a prior art static random-access memory (SRAM) card is shown in FIG. 15. Differences between the configuration of this SRAM card and that of the previously described ROM card are given below. In order to preserve data when the 5 V power supply is off, the SRAM card is further provided with a built-in battery 80, rectifying elements such as diodes 70 and 71, and a low-voltage detection circuit 135 that detects a drop in the power supply voltage. The interface circuit 10 also has the circuit that puts the SRAM in a standby state when a detection signal is received from the low-voltage detection circuit 135 to indicate that the power supply is off.

The power supply voltage of semiconductor integrated circuits was initially either 12 V or dual power supplies of 12 V and 5 V for a metal-oxide-semiconductor (MOS) type of IC. However, the 5 V power supply has been standard for quite some years. The same is true with the Transistor-Transistor Logic (TTL) which uses bipolar transistors. This means that host systems such as personal computers and ATM installations created with a 5 V power supply rating have become common.

Admist recent advances and developments in semiconductor technology, increase in the size and capacity of ICs have led to a trend by which the power supply of the latest ICs has moved from 5 V to 3.3 V or 3 V. There are two reasons for this.

The first reason is the reduction in size of metal-oxide-semiconductor field-effect transistors (MOSFETs) that form integrated circuits. That is, as the channel length that is an indicator of MOSFET tininess approaches 0.5 µm, it has become difficult to guarantee the same maximum rated voltage for these tiny MOSFETs as that of integrated circuits that operate on a 5 V power supply. Therefore, the minimum value of the maximum rated voltage of ICs with an operating supply voltage of 3.3 V or 3 V is 4.6 V.

The second reason is to suppress any increase in power consumption concomitant with increasing size, by reducing the power supply voltage. That is, the power comsumption of a MOSFET is proportional to load capacities such as its gate capacity, as well as the clock frequency and the power supply voltage. Therefore, setting this power supply voltage to 3.3 V or 3 V enables a reduction in power consumption.

In response to this trend, JEIDA is planning to publish 3.3 V standards by March 1993.

In order to increase the capacity of IC cards and make them faster, it is desirable to fabricate them by the above state-of-the-art techniques. Therefore, it is considered that it will be common for IC cards to be rated for either 3.3 V or 3 V. However, many of the host systems into which there IC cards will be inserted are existing popular systems rate for 5 V, and such host systems will not necessarily be limited to those rated for 3.3 V or 3 V in the future. Therefore, it is preferable that an IC card created so as to be rated for 3.3 V or 3 V can not only cope with a host system that has a card slot rated for 3.3 V or 3 V; it should also be capable of coterminal with existing popular host systems having card slots rated at 5 V.

However, the maximum rated voltage of the power supply of an IC card rated for 3.3 V or 3 V is, as described above, low (4.6 V), so that when it is used in one of the existing popular host systems that are rated for 5 V, there are problems such that it could be damaged or even in the worst case destroyed. On the other hand, if such an IC card rated for 3.3 V or 3 V is used in a host system that is rated for 3.3 V or 3 V, it must always operate as normal, without any changes. Therefore, it is preferable to have an IC card which is not destroyed even if it is used in a host system that is rated for 5 V, or which should operate normally therein, and which can also operate normally when used in a host system that is rated for 3.3 V or 3 V.

A technique of protecting an IC card from destruction when it is inserted into a host system has already been disclosed in, for example, Japanese Patent Application Laid-Open No. Hei2-259853. However, this prior art technique is intended to protect the signal terminals of an EEPROM card from high voltages when the card is inserted, and involves the insertion of components such as diodes and resistance elements into the signal terminals. Therefore, this prior art technique does not relate to an IC card itself. It relates to the protection of signals terminals of an IC card, further, this prior art technique discloses nothing about the concept that the power supply is either cut off completely or it is cut off and a regulated voltage is supplied if the IC card is inserted into a host system rated for 5 V, but the power is supplied as usual if the IC card is inserted into a host system rated for 3.3 V or 3 V.

In addition, Japanese Patent Application Laid-Open No. Hei4-30208 discloses a technique whereby the voltage of an external power supply or backup battery is detected when the IC card is inserted or removed, and, if this voltage is less than the minimum operating voltage, operation of the memory is disabled. However, this prior art technique detects only the minimum operating voltage of the IC; it does not detect the maximum rated voltage in any way. Moreover, after it has detected the voltage, it simply disables the operation of the memory to prevent any loss of the stored data; nothing is disclosed about cutting off the power supply completely or cutting off the power supply and supplying a regulated-voltage.

When an IC card is connected to electronic equipment of differing power ratings by means such as a communications cable, the technique described below could be considered. That is, the connector shape for a communications cable for an electronic device rated for 5 V, for example, could be made different from that of a communications cable for an electronic device related for 3.3 V, so that erroneous connection is impossible. However, in order to make such an IC card readily portable, it must be small, so it is not easy to provide different connector shapes in this manner.

The requirement of universality placed on the IC card means that the connector is provided with only a small number of terminals and the assignment of power supply and signals to the terminals is standardized. Therefore, it is difficult to provide a configuration wherein, for example, both a 5 V power supply terminal and a 3.3-V or 3-V power supply terminal are provided separately.

Further, to connect electronic devices having mutually independent power supplies, as described in the above examples, it is only necessary to provide circuits that shift the levels of the signals alone, and normal operation can be guaranteed by simply providing some means of preventing connection of power supplies of the electronic devices. In contrast, the IC card is characteristics in that its power supply is dependent on the power supply of the host system. Therefore, simply preventing connection to the power supply terminal could result in a malfunction such that the IC card cannot operate, even when it is inserted into a host system that is rated for 3.3 V or 3 V.

An IC card is not always used inserted into a host system; it also has a feature in that a user can carry around an IC card in which user-related data is stored, for use in a wide variety of different electronic devices. For example, an IC card for use in ATM installations is designed so that the user carries around an IC card on which is stored data relating to the user, such as a security code, and this card can be inserted into an unspecified large number of ATM installations for use. With this usage pattern, the power supply ratings of ATM installations into which the IC card can be inserted are unpredictable, so that, with a prior art IC card, the user is required to check the power supply rating every time the IC card is inserted. However, it is a heavy demand on the user to perform this check every time the IC card is inserted, so that the characteristics of universality and convenience that are inherent to an IC card are lost. Further, if the IC card is inserted by mistake into a device of a different power supply rating, the IC card could be destroyed and the user-related data such as security codes could be lost, so that characteristics of high levels of reliability and security that are inherent to the IC card are lost.

Further, whenever an IC card rated for 3.3 V or 3 V is inserted into a host system that is rated for 3.3 V or 3 V, it must operate correctly as usual. Therefore, it is not preferable to have a voltage drop in the power supplied from the host system, for instance. This is because, if this drop in the power supply voltage is large, the voltage difference between the voltage of signals such as the address and control signals and the power supply voltage also becomes large, and problems such as latch-up are likely to occur. Therefore, it is preferable to either prevent this voltage drop from occurring, or, if it does occur, to make sure that the voltage drop is as small as possible.

SUMMARY OF THE INVENTION

The present invention was devised with the aim of solving the above problems, and has as its objective, the provision of an IC card that consumes very little power and can either be used in a new type of host system that has a new, lower power supply voltage rating or can be connected to an existing host system that has a higher power supply voltage rating, without deteriorating or being destroyed.

Another objective of the present invention is to provide an IC card that consumes very little power and can be used in either a new type of host system that has a new, lower power supply voltage rating or in an existing host system that has a higher power supply voltage rating.

To achieve the above described objectives, one aspect of the present invention relates to an IC card comprising a main circuit, a connector for connecting said IC card to a host system, and an interface circuit provided between said connector and said main circuit, wherein:

said interface circuit comprises an external interface circuit, an internal interface circuit, a switching means, and a voltage detection means;

said external interface circuit provides connections for signals between said host system and said internal interface circuit, and a power supply line of the external interface circuit is connected to a first power supply line that is a power supply line of said host system;

said internal interface circuit provides connections for signals between said external interface circuit and said main circuit, and a power supply line of the internal interface circuit is connected to a second power supply line that is a power supply line of said main circuit;

said switching means performs a switching operation that places a link between said first power supply line and said second power supply line in either a conductive state of a non-conductive state, either directly or via a rectifying element, based on a detection result of said voltage detection means; and the voltage of said first power supply line is detected by said voltage detection means, and, when the absolute value of said voltage of the first power supply line is less than or equal to the absolute value of a previously set prescribed voltage, said link between said first power supply line and said second power supply line is placed in a conductive state by said switching means, but when the absolute value of said voltage of said first power supply line is greater than the absolute value of said prescribed voltage, said link between said first power supply line and said second power supply line is placed in a non-conductive state by said switching means.

In accordance with this aspect of the present invention, if the IC card is inserted into a host system that supplies power at a voltage less than or equal to the previously set prescribed voltage, the link between the first power supply line that is a power supply line of the host system and the second power supply line that is a power supply of the main circuit is placed in a conductive state by the voltage detection means and the switching means, either directly or via a rectifying element. This ensures that the power supply of the host system is supplied almost directly to the main circuit. If, on the other hand, the IC card is inserted into a host system that supplies power at a voltage that is greater than the previously set prescribed voltage, the link between the first power supply line and the second power supply line is placed in a non-conductive state by the voltage detection means and the switching means. This ensures that the power supply of the host system is cut off from the main circuit. Therefore, this enables the implementation of an IC card where in the main circuit does not deteriorate or become damaged, even if it is connected to a host system of a different voltage rating. In addition, the latest types of IC can be incorporated in the IC card, such as an IC rated for 3.3 V, thus enabling the implementation of a highly reliable IC card which is larger in capacity, faster, and less power-consuming, and which is thus suitable as an external device for electronic equipment.

In another aspect of the present invention, said interface circuit further comprises a regulated-voltage circuit; and the voltage of said first power supply line is regulated by said regulated-voltage circuit so that, when said link between said first power supply line and said second power supply line has been placed in a non-conductive state by said switching means, said regulated voltage is provided to said second power supply line.

In accordance with this aspect of the present invention, if the IC card is inserted into a host system that supplies power at a voltage less than or equal to the previously set prescribed voltage, the link between the first power supply line that is a power supply line of the host system and the second power supply line that is a power supply line of the main circuit is placed in a conductive state by the voltage detection means and the switching means, either directly or via a rectifying element. This ensures that the power supply of the host system is supplied almost directly to the main circuit. In this case, it is preferable that the regulated-voltage circuit is set not to operate. If, on the other hand, the IC card is inserted into a host system that supplies power at a voltage that is greater than the previously set prescribed voltage, the link between the first power supply line and the second power supply line is placed in a non-conductive state by the voltage detection means and the switching means. However, the arrangement is such that the regulated voltage by the regulated-voltage circuit is supplied to the main circuit. This enables the implementation of an IC card that can operate as normal, even when it is inserted into a host system that supplies a voltage that is greater that the prescribed voltage. This also means that the latest types of IC can be incorporated in the IC card, such as an IC rated for 3.3 V, thus enabling the implementation of a highly reliable IC card which is larger in capacity, faster, and less power-consuming, and which is thus suitable as an external device for electronic equipment. Further, this enables the implementation of an IC card wherein data obtained from a host system that is rated for 3.3 V can be used by a host system that is rated for 5 V, for example, and, conversely, data obtained from a host system that is rated for 5 V can be used by a host system that is rated for 3.3 V. This further emphasizes the characteristics such as convenience and universality of such an IC card.

In a further aspect of the present invention, said switching means is configured of a CMOS transfer gate having first, second, and third terminals; and said first terminal is connected to said first power supply line, said second terminal is connected either directly or via a rectifying element to said second power supply line, and a switching operation to place a link between said first terminal and said second terminal in either a conductive state or a non-conductive state is performed through the control of said third terminal which is a gate electrode, based on a detection result of said voltage detection means.

In accordance with this aspect of the present invention, the switching means is configured of a CMOS transfer gate. Therefore, when the switching means has been placed in a conductive (ON) state, very little corresponding drop in voltage occurs as the load current consumed by the main circuit increases. As a result, the power supply voltage can be kept in a simple manner within the recommended operating voltage range, and also undesirable phenomena such as latch-up can be prevented in an effective manner. This can lead to a huge increase in reliability.

The present invention is further characterized in that said prescribed voltage is set to an upper-limit voltage that is a voltage between the maximum rated voltage of said main circuit and the operating voltage of said main circuit.

In accordance with this aspect of the present invention, the prescribed voltage is set to an upper-limit voltage that is between the maximum rated voltage and the operating voltage of the main circuit. Therefore, if the power supply voltage of the host system is greater than this upper-limit voltage, it can be guaranteed this power supply voltage not to be applied to the main circuit, and thus it can be guaranteed that a voltage of greater than the maximum rated voltage is not applied to the main circuit. In addition, if the power supply voltage of the host system is less than or equal to this upper-limit voltage, the power supply voltage of the host system is applied unchanged to the main circuit, ensuring the optimal operation of the main circuit. In this case, the power supply of the host system into which the IC card is inserted can normally be either of two voltages, such as 5 V or 3.3 V. Therefore, even if a decision is made to switch the link between the first power supply line and the second power supply line to either a conductive or a non-conductive state, based only on the upper-limit voltage, highly reliable power supply switching can be performed.

In a yet further aspect of the present invention, said voltage detection means comprises a high-voltage detection means and a low-voltage detection means;

a voltage that guarantees a lower-limit operation of said main circuit is set as a lower-limit voltage;

the voltage of said first power supply line is detected by said low-voltage detection means, and, when the absolute value of said voltage of said first power supply line is less than or equal to the absolute value of said lower-limit voltage, the operation of at least said main circuit is disabled; and the voltage of said first power supply line is detected by said high-voltage detection means, and, when the absolute value of said voltage of said first power supply line is less than or equal to the absolute value of said upper-limit voltage, said link between said first power supply line and second power supply line is placed in a conductive state by said switching means, but when the absolute value of said voltage of said first power supply line is greater than said upper-limit voltage, said link between said first power supply line and said second power supply line is placed in a non-conductive state by said switching means.

In accordance with this aspect of the present invention, the provision of a low-voltage detection means ensures that a lower-limit voltage can be detected as well. If the voltage of the power supplied by the host system is less than or equal to this lower-limit voltage, the operation of at least the main circuit is set to be disabled. This ensures normal operation of the IC card including when the IC card is inserted into the host system.

The present invention is further characterized in that said interface circuit is formed on a single CMOS chip;

said CMOS chip comprises a first well or a plurality of first wells provided for the use of circuits and means other than said internal interface circuit, and a second well or a plurality of second wells provided for the use of said internal interface circuit; and said first power supply line is connected to said first well or wells, said second power supply line is connected to said second well or wells, and said first well or wells are electrically separated from said second well or wells.

In accordance with this aspect of the present invention, the interface circuit has a one-chip configuration. This enables a reduction in the power consumption and reduction in costs by reducing the number of components. Moreover, in this case, the first well or wells provided for the circuits and means other that the internal interface circuit are electrically separated from the second well or wells provided for the internal interface circuit. Therefore, the voltage of the first power supply line can be easily prevented from being transferred to the main circuit via a protection diode and parasitic diode. This enables a further increase in the reliability of the IC card.

In an even further aspect of the present invention, said interface circuit is formed on a single CMOS chip; and driver transistors are provided instead of said internal interface circuit, wherein gate electrodes thereof are connected to signal terminals of said external interface circuit, source regions thereof are connected to a reference power supply that is a power supply of the substrate of said CMOS chip, and drain regions thereof are connected to signal terminals of said main circuit and also to said second power supply line via a resistive element.

In accordance with this aspect of the present invention, the interface circuit has a one-chip configuration. This enables a reduction in the power consumption and a reduction in costs by reducing the number of components. In addition, driver transistors are provided wherein gate electrodes thereof are connected to signal terminals of the external interface circuit, source regions thereof are connected to a reference power supply, and drain regions thereof are connected to signal terminals of the main circuit and also to the second power supply line via a resistive element. This configuration ensures that the first power supply line voltage can be easily prevented from being transferred to the main circuit via a protection diode and parasitic diode. This enables a further increase in the reliability of the IC card.

In a still further aspect of the present invention, said interface circuit does not comprise said internal interface circuit;

said external interface circuit provides connections for signals between said host system and said main circuit;

said interface circuit and said main circuit are formed on a single CMOS chip;

said CMOS chip comprises a first well or a plurality of first wells provided for the use of said interface circuit and a second well or a plurality of second wells provided for the use of said main circuit; and said first power supply line is connected to said first well or wells, said second power supply line is connected to said second well or wells, and said first well or wells are electrically separated from said second well or wells.

In accordance with this aspect of the present invention, the interface circuit and the main circuit have a one-chip configuration. This enables an even greater reduction in the power consumption and reduction in costs by reducing the number of components than that achieved by giving the interface circuit alone a one-chip configuration. In addition, the first well or wells provided for the use of the interface circuit are electrically separated from the second well or wells provided for the use of the main circuit. This configuration ensures that the first power supply line voltage can be easily prevented from being transferred to the main circuit via a protection diode and a parasitic diode. This enables a further increase in the reliability of the IC card.

BRIEF DESCRIPTION OF THE DRAWINGS

FIG. 9B is a schematic diagram used to illustrate a sixth embodiment of the present invention.

DESCRIPTION OF THE PREFERRED EMBODIMENTS

Preferred embodiments of the present invention are described below in detail. Note that, in order to simplify the diagrams, the numbers of signal lines such as control, address input, and data lines have been reduced in the descriptions of the embodiments below. In addition, descriptions of components that have no direct relationship with the present invention have been omitted. Further, the present invention does not relate only to a host system and an IC card that are rated for 3.3 V, it can naturally be applied to a rating of less than 3.3 V (such as 3 V), but the rating of 3.3 V is taken by way of example in the description below.

First Embodiment

Figure 1:
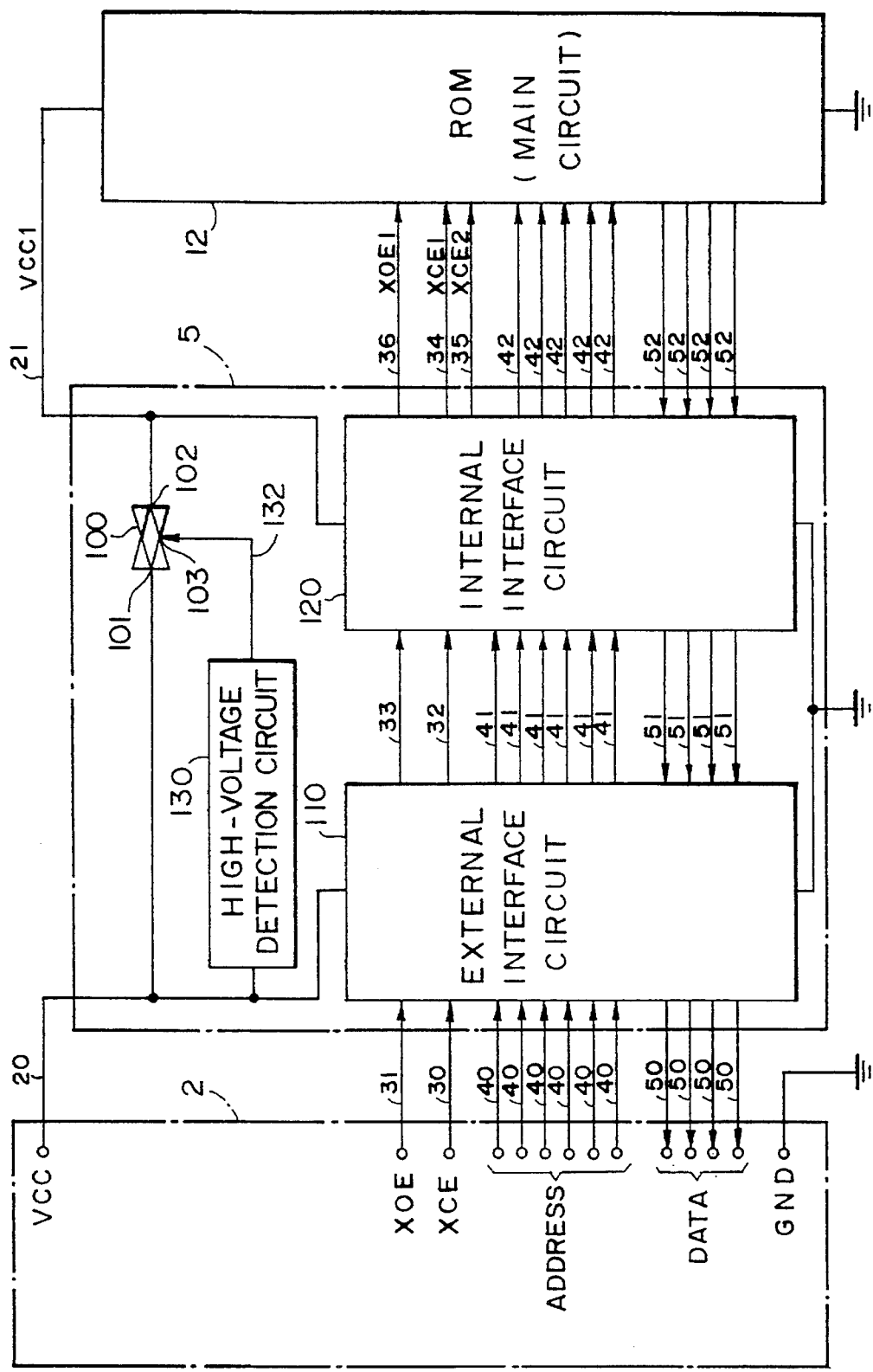
FIG. 1 is a block diagram of a first embodiment of the present invention.

A block diagram of an IC card relating to a first embodiment of the present invention is shown in FIG. 1. Note that the main circuit of this first embodiment is a ROM 12.

The first embodiment is configured to comprise a connector 2, an interface circuit 5, and the ROM 12 that is the main circuit, as shown in FIG. 1.

Figure 14:
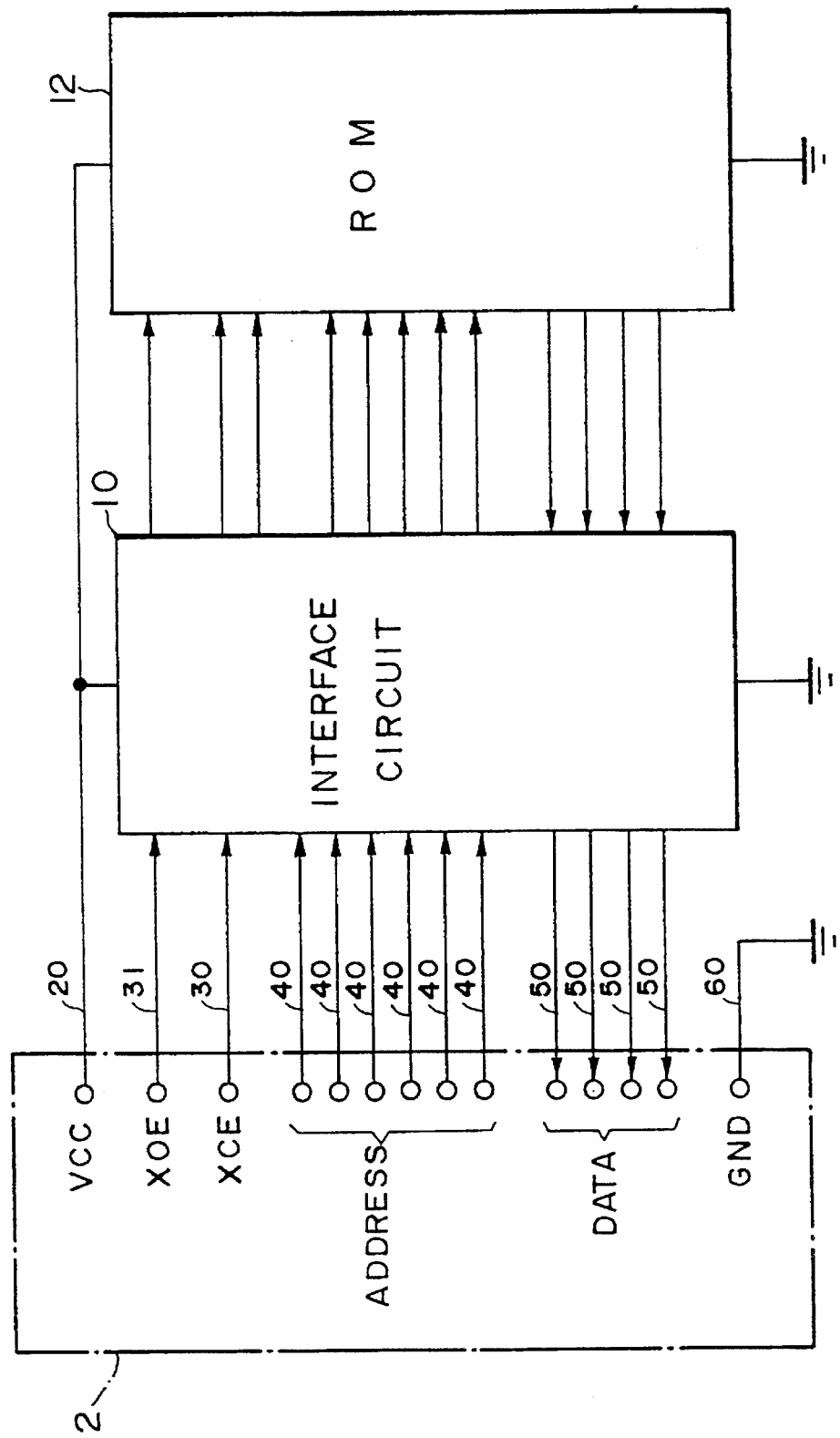
FIG. 14 is a block diagram of a prior art example of an IC chip wherein the main circuit is a ROM.
Figure 15:
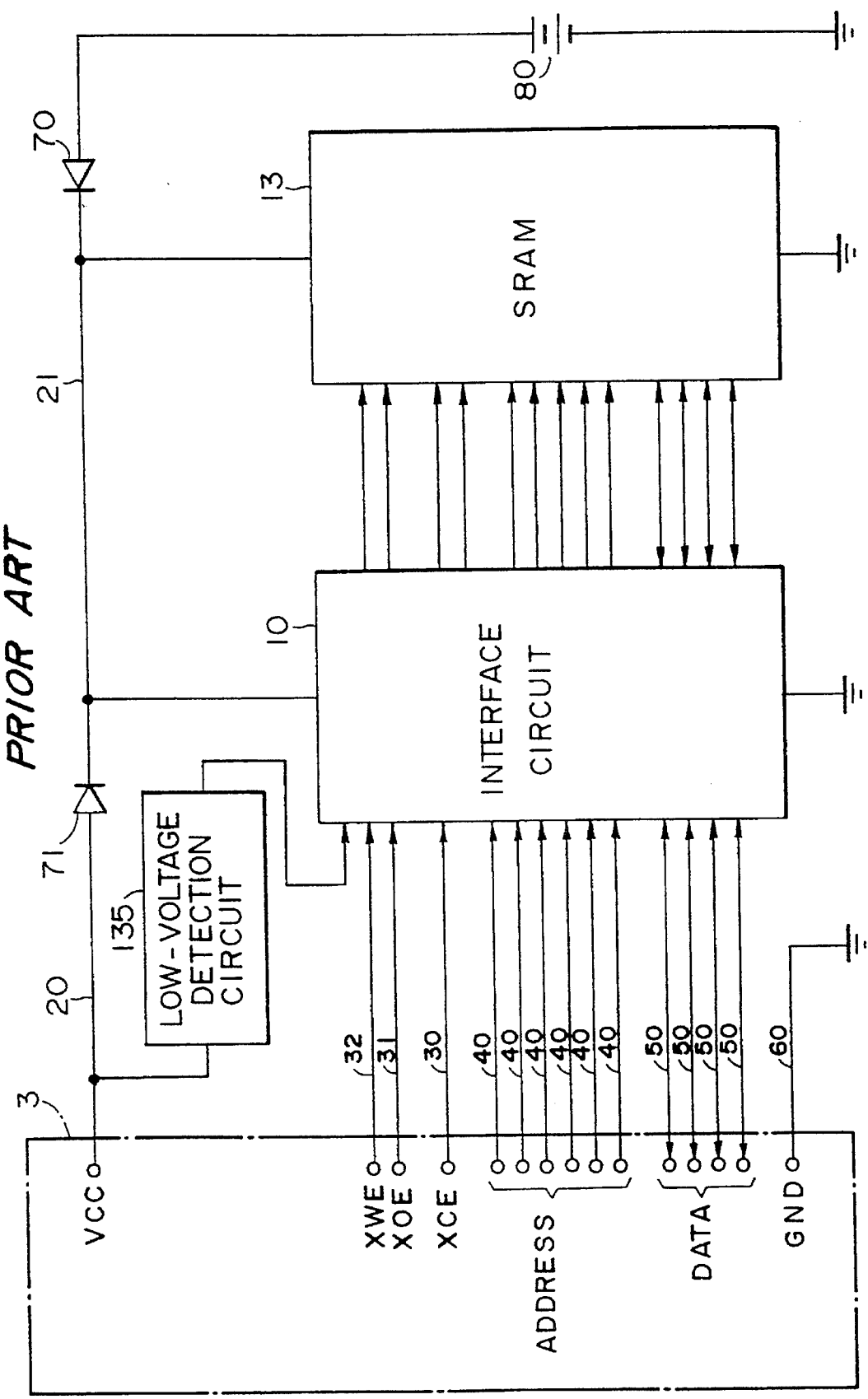
FIG. 15 is a block diagram of a prior art example of an IC chip wherein the main circuit is an SRAM.

This first embodiment shown in FIG. 1 differs from the prior art example of an IC card shown in FIG. 14 in that the interface circuit 10 has become the interface circuit 5, and the power line has been divided into an external power line (first power supply line) 20 and an internal power line (second power supply line) 21. Connection and disconnection of the external power line 20 to the internal power line 21 is performed by the interface circuit 5. This configuration ensures that, if a power supply voltage greater than the maximum rated voltage of the ROM 12 is applied to the memory card from the outside, the ROM 12 can be protected from damage in an effective manner.

The interface circuit 5 shown in FIG. 1 is configured to comprise an analog switch 100, an external interface circuit 110, an internal interface circuit 120, and a high-voltage detection circuit 130.

The analog switch 100 has first, second, and third terminals 101, 102, and 103, and the first terminal 101 is connected to the external power line 20. The external power line (first power supply line) 20 is connected directly to the power supply terminal of the connector 2 and acts as a power line for supplying the power supply Vcc from the host system to the IC card. The second terminal 102 is connected to the internal power line 21. The internal power line (second power supply line) 21 acts as a power line for supplying a power supply Vcc1 to the ROM 12 that is the main circuit and the internal interface circuit 120. The third terminal 103 is connected to a control signal 132 that is an output of the high-voltage detection circuit 130. This third terminal 103 is also controlled by the control signal 132 to put a link between the first terminal 101 and the second terminal 102 in either a conductive (ON) or a non-conductive (OFF) state.

The external interface circuit 110 is configured to comprise components such as input and output circuits that are not shown in the figure. Control signals 30 and 31 that are a chip enable signal XCE and an output enable signal XOE are input with the address signals 40 to this input circuit from the host system through the connector 2. The arrangement is such that these signals 30, 31, and 40 are each output to the internal interface circuit 120 as output signals 32, 33, and 41. In addition, output signals 51 from the internal interface circuit 120 are input to the output circuit. The arrangement is such that these output signals 51 are output to the host system as the data signals 50.

A power supply terminal of the external interface circuit 110 is connected to the external power line 20, thereby making the power supply line of the external interface circuit 110 common with the power supply Vcc line of the host system.

Note that the "X" at the beginning of the names of the above described XCE and XOE signals expresses negative logic, and does so throughout the present document.

The internal interface circuit 120 comprises logic and drive circuits that receives the output signals 32, 33, and 41 from the external interface circuit 110, and generate output signals 34, 35, 36, and 42 to the ROM 12, and circuits that receive output signals 52 from the ROM 12 and generate output signals 51 to the external interface circuit 110.

In addition, a power supply terminal of the internal interface circuit 120 is connected to the internal power line 21, thereby making the power supply line of the internal interface circuit 120 common with the power supply Vcc1 line of the main circuit.

The high-voltage detection circuit 130 is connected to the external power line 20, thereby providing detection of the power supply Vcc of the host system. The high-voltage detection circuit 130 determines whether the thus-detected voltage is greater than or equal to a previously set prescribed voltage, or whether it is smaller than the prescribed voltage. The control signal 132 is generated on the basis of this decision result to provide control that puts the analog switch 100 in either a conductive (ON) state or a non-conductive (OFF) state. A specific example of this control is described below.

The prescribed voltage is a voltage intermediate between the maximum rated voltage 4.6 V of the ROM 12 that is the main circuit and the operating voltage 3.3 V of the ROM 12 (hereinafter, this voltage is called the upper-limit voltage), and is set to 4 V, for example. If the voltage of the power supply Vcc of the host system is greater than or equal to the upper-limit voltage 4 V, the analog switch 100 is controlled to be in a non-conductive (OFF) state. Conversely, if the voltage of the power supply Vcc of the host system is less than the upper-limit voltage 4 V, the analog switch 100 is controlled to be in a conductive (ON) state.

The operation of this first embodiment of the present invention will now be described.

The description first concerns the operation when this IC card is inserted into the card slot of a host system that is rated for 3.3 V. In this case, a power supply voltage of 3.3 V is applied to the external power line 20. The high-voltage detection circuit 130 detects this power supply voltage. The thus-detected power supply voltage (3.3 V) is less than the upper-limit voltage 4 V, so the analog switch 100 is put into the conductive (ON) state by the control of the high-voltage detection circuit 130. As a result, the link between the external power line 20 and the internal power line 21 is made conductive, and thus the power supply voltage 3.3 V of the host system is applied almost directly to the internal power line 21. The internal interface circuit 120 and the ROM 12 that is the main circuit are made operative by the thus-applied power supply voltage.

Next, the description turns to the operation of this IC card when it is inserted into the card slot of a host system that is rated for 5 V. In this case, a 5 V power supply voltage is applied to the external power line 20. The high-voltage detection circuit 130 detects this power supply voltage. The thus-detected power supply voltage (5 V) is greater than the upper-limit voltage 4 V, so that analog switch 100 is put into the non-conductive (OFF) state by the control of the high-voltage detection circuit 130. As a result, the link between the external power line 20 and the internal power line 21 is made non-conductive, and thus the power supply voltage 5 V of the host system is not applied to the internal power line 21. The power supply line of the internal interface circuit 120 and the main circuit 12 is made common, as described above. Therefore, signals of a voltage of 5 are not applied to the terminals of the ROM 12 through the signals lines 34, 35, 36, 42, and 52 of the internal interface circuit 120.

In accordance with this first embodiment as described above, normal operation can be guaranteed if an IC card that is rated for 3.3 V is inserted into a host system that is rated for 3.3 V, but, in addition, there is no danger of the IC card being damaged if it is inserted into a host system that is rated for 5 V. This enables an increase in reliability. Further, the latest type of larger in scale of integration, faster, less power-consuming IC can be incorporated as the main circuit of the IC card, with an operating voltage of 3.3 V and a maximum rated voltage of 5 V or less. As a result, the IC card itself can be made larger in capacity, faster, and less power-consuming.

In accordance with this first embodiment, the power supply voltage of the host system is detected by the high-voltage detection circuit 130 and the power supply voltage to be applied to ROM 12 is automatically switched. Therefore, there is no need to give the connector 2 a different shape to make it impossible to connect it to a host system that is rated for 5 V, nor is it necessary to provide both a 5-V power supply terminal and a 3.3-V power supply terminal on the connector 2.

Further, in accordance with this first embodiment, the user can carry the IC card around, and it is no longer necessary for the user to check the power supply rating every time the IC card is inserted, even when it could inserted into a large number of different electronic devices. Therefore, characteristics inherent to the IC card, such as universality and convenience, are not lost. In addition, if the user should accidently insert the IC card into a device of a different power supply rating, user-related data such as security codes will not be destroyed. Therefore, characteristics inherent to the IC card, such as its high levels of reliability and security, are not lost.

In addition, in this first embodiment, connection and disconnection of the external power line 20 and the internal power line 21 is performed by an analog switch 100, that could be, for example, a CMOS transfer gate. Therefore, if the IC card is inserted into a host system that is rated for 3.3 V and the analog switch (transfer gate) 100 has been placed in a conductive (ON) state, virtually no drop in the voltage between the first and second terminals occurs. As a result, the 3.3 V power supply is supplied unchanged to the ROM 12 that is the main circuit. This ensures that no large voltage difference is generated between the voltages of the address and control signals and the voltage of the power supply, which can prevent the occurrence of latch-up in an effective manner.

Second Embodiment

Figure 2:
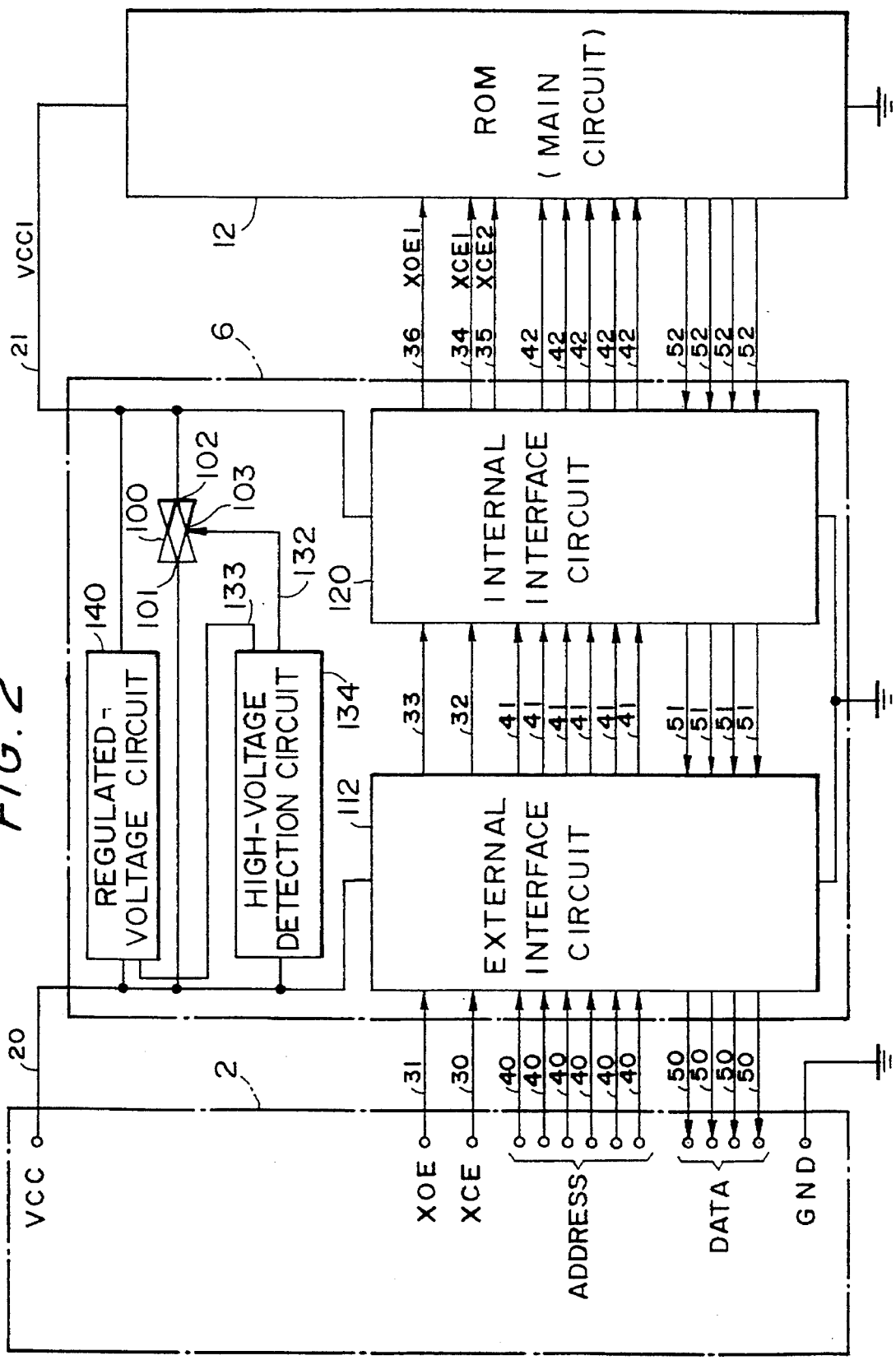
FIG. 2 is a block diagram of a second embodiment of the present invention.

A block diagram of an IC card relating to a second embodiment of the present invention is shown in FIG. 2.

This second embodiment shown in FIG. 2 differs from the first embodiment shown in FIG. 1 in the configuration of an interface circuit 6. That is, the interface circuit 6 is configured such that it also comprises a regulated-voltage circuit 140. This configuration ensures that, if the IC card is inserted into a host system that is rated for 5 V, the 5-V power supply voltage is regulated to 3.3 V voltage to enable the IC card to operate.

The configurations of the analog switch 100 and the internal interface circuit 120 are the same as in the first embodiment shown in FIG. 1, and thus description thereof is omitted.

An external interface circuit 112 has the same configuration as the external interface circuit 110 of the first embodiment in that it comprises an input circuit for the XOE, XCE, and address signals, and an output circuit for the data signals. However, the output circuit is provided with a CMOS inverter with a lowered threshold voltage. If the power supply voltage of the host system into which the IC card is inserted is 5 V, an input signal of amplitude 3.3 V is input from the internal interface circuit 120 so that the output circuit can still operate.

A high-voltage detection circuit 134 is connected to the external power line 20, and the power supply Vcc of the host system is detected thereby. The high-voltage detection circuit 134 determines whether or not the thus-detected voltage is greater than a prescribed voltage. That is, in the same manner as in the first embodiment, it determines whether or not the thus-detected voltage is less than the maximum rated voltage 4.6 V of the ROM 12 that is the main circuit, and greater than the upper-limit voltage 4 V that is greater than the operating voltage 3.3 V. A control signal 132 and a control signal 133 are generated on the basis of this decision.

The control signal 132 is input to the third terminal 103 of the analog switch 100, in the same manner as in the first embodiment. In addition, the control signal 133 is input to the regulated-voltage circuit 140. If the power supply voltage of the host system is less than the upper-limit voltage 4 V, the analog switch 100 is placed into a conductive (ON) state by the control signal 132, and also the regulated-voltage circuit 140 is set to a non-operating state by the control signal 133. Conversely, if the power supply voltage of the host system is greater than the upper-limit voltage 4 V, the analog switch 100 is placed into a non-conductive (OFF) state by the control signal 132, and also the regulated-voltage circuit 140 is set to an operating state by the control signal 133.

Note that the above description concerns a case wherein two control signals 132 and 133 control the analog switch 100 and the regulated-voltage circuit 140. However, the circuit configuration of the analog switch 100 and the regulated-voltage circuit 140 could be made such that they are controlled by a single control signal.

The regulated-voltage circuit 140 is provided to regulate the power supply voltage Vcc of the host system that is input via the external power line 20, and thus supply a power supply voltage of 3.3 V to the internal power line 21. The arrangement is such that the regulated-voltage circuit 140 is controlled to be in either an operating state or a non-operating state by the control signal 133, as described above.

Figure 3:
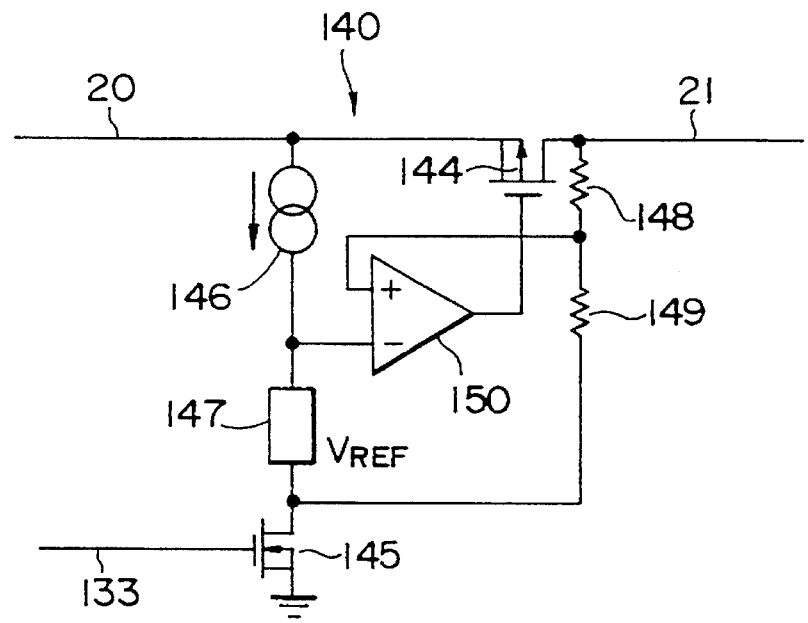
FIG. 3 shows one example of a circuit diagram of a regulated-voltage circuit used in the present invention.
Figure 4:
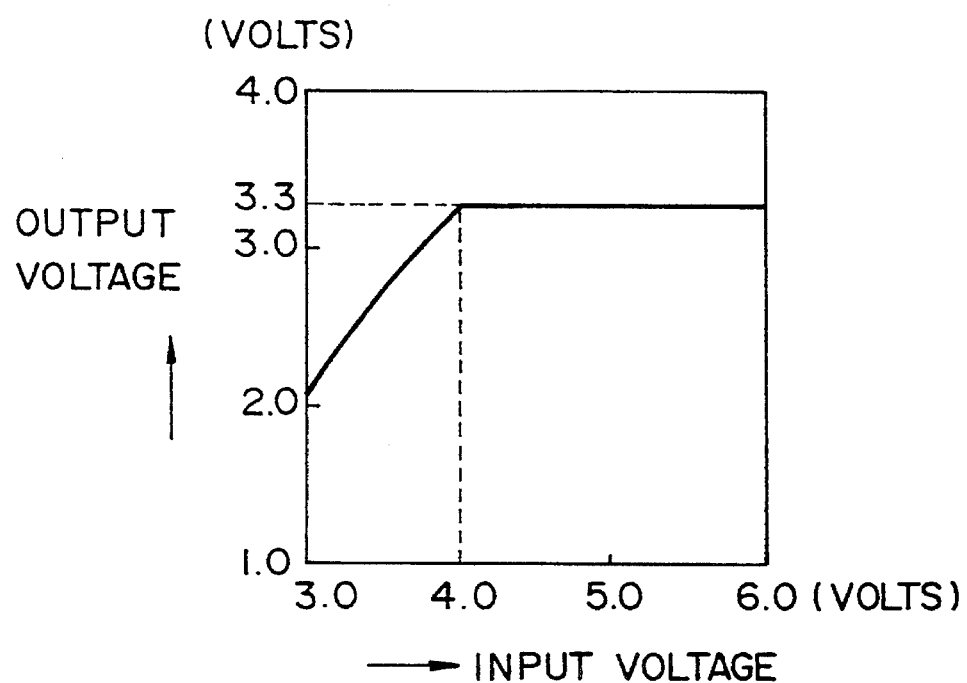
FIG. 4 is a graph of the input-output characteristic of the regulated-voltage circuit of the present invention.

An example of the circuit configuration of the regulated-voltage circuit 140 is shown in FIG. 3, and the input-output characteristic of the regulated-voltage circuit 140 is shown in FIG. 4.

The regulated-voltage circuit 140 is configured to comprise a p-channel MOS transistor 144 for output purposes, an n-channel MOS transistor 145 for setting either the operating state or the non-operating state, a fixed-current circuit 146, VREF circuit 147, and resistors 148 and 149, as shown in FIG. 3.

When the control signal 133 in FIG. 3 is high, the n-channel MOS transistor 145 is placed in a conductive (ON) state and the regulated-voltage circuit 140 is set to an operating state. Therefore, as shown in FIG. 4, even if the voltage of the external power line 20 reaches or exceeds 4 V, the voltage of the internal power line 21 is always regulated at 3.3 V. This ensures that the ROM 12 that is the main circuit and the internal interface circuit 120 are always supplied with the 3.3 V power supply.

In contrast, when the control signal 133 is low, the n-channel MOS transistor 145 is placed in a non-conductive (OFF) state and the regulated-voltage circuit 140 is set to the non-operating state. When the regulated-voltage circuit 140 is set to the non-operating state, the current path from the external power line 20 and the internal power line 21 to ground disappears, so the power consumption is zero. This sets the output of the regulated-voltage circuit 140 to a high impedance state. However, in this case, since the analog switch 100 is placed in a conductive (ON) state by the control signal 132 of FIG. 2, the power supply Vcc of the host system is supplied unchanged to the internal power line 21.

Next, the description concerns how the regulated-voltage circuit 140 should output a regulated voltage for the operating state.

A reference voltage VREF which is previously set to correspond to the operating voltage of the ROM 12 that is the main circuit, and which is independent of the input and output voltages, is output from the VREF circuit 147. In the operating state, this reference voltage VREF is compared by an op-amp 150 with an output voltage divided by the resistors 148 and 149. The op-amp 150 controls the p-channel MOS transistor 144 to be in either a conductive (ON) state or a non-conductive (OFF) state in accordance with this comparison result. More specifically, if the output load current increases so that the output voltage falls slightly below the set voltage, the output of the op-amp 150 goes low and the p-channel MOS transistor 144 is placed in a conductive (ON) state. This causes a current to flow from the external power line 20 to the internal power line 21, which pulls up the output voltage. ON the other hand, if the output load current decreases so that the output voltage rises slightly above the set voltage, the output of the op-amp 150 goes high and thus the p-channel MOS transistor 144 is placed in a non-conductive (OFF) state. This limits the current flowing from the external power line 20 to the internal power line 21, pulling down the output voltage. In this manner, the output voltage can be held at a regulated value.

Note that the configuration of the regulated-voltage circuit 140 is not limited to the circuit configuration shown in FIG. 3. So long as the operating voltage of the ROM 12 that is the main circuit remains within the permissible range, the output voltage could rise slightly higher than the 3.3 V corresponding to the input voltage.

The operation of this second embodiment will now be described.

If this IC card has been inserted into a host system that is rated for 3.3 V, the operation is the same as described above for the first embodiment. In this case, this means that the analog switch 100 is placed in a conductive (ON) state by the control signal 132 that is the output of the high-voltage detection circuit 134, and thus the power supply Vcc of the host system is supplied almost directly to the ROM 12 that is the main circuit and the internal interface circuit 120. Note that, in this case, the regulated-voltage circuit 140 is placed in the non-operating state by the control signal 133, so that the regulated-voltage circuit 140 does not consume power, and also the output thereof is placed in a high impedance state.

The description now turns to the operation when this IC card is inserted into the card slot of a host system that is rated for 5 V. In this case, the power supply voltage (5 V) of the host system detected by the high-voltage detection circuit 134 is greater than the upper-limit voltage 4 V. Therefore, the analog switch 100 is placed in a non-conductive (OFF) state by the control signal 132. On the other hand, since the regulated-voltage circuit 140 is placed in an operating state by the control signal 133 in this case, the power supply voltage (5 V) of the host system is regulated to 3.3 V and is output by the regulated-voltage circuit 140. As a result, the 3.3 V power supply voltage is applied to the internal power line 21, the ROM 21 that is the main circuit, the internal interface circuit 120.

In accordance with this second embodiment as described above, normal operation of an IC card that is rated for 3.3 V can be guaranteed, regardless of whether this IC card is inserted into a host system that is rated for 3.3 V or a host system that is rated for 5 V. This makes it possible to incorporate the latest type of IC rated for 3.3 V into the IC card as the main circuit, so that the IC card itself can be made larger in capacity, faster, and less power-consuming.

In addition, in accordance with this second embodiment, in the same manner as in the first embodiment described above, there is no need to give the connector 2 a different shape to make it impossible to connect it to a host system that is rated for 5 V, nor is it necessary to provide both a 5 V power supply terminal and a 3.3-V power supply terminal on the connector 2. In addition, it is no longer necessary for the user to check the power supply rating every time the IC card is inserted, and, if the user should accidently insert the IC card into a device of a different power supply rating, user-related data will not be destroyed. Further, data obtained from a host system that is rated for 3.3 V can be used by a host system that is rated for 5 V, and, conversely, data obtained from a host system that is rated for 5 V can be used by a host system that is rated for 3.3 V. Thus this second embodiment makes it possible to further improve the characteristics inherent to the IC card, such as universality, convenience, and high levels of reliability and security.

In addition, in this second embodiment, the connection and disconnection of the link between the external connection line 20 and the internal connection line 21 is performed by an analog switch 100, that could be, for example, a CMOS transfer gate. Therefore, if the IC card is inserted into a host system that is rated for 3.3 V, virtually no drop in the voltage between the first and second terminals occurs, even if the load current consumed by the ROM 12 increases. As a result, the 3.3-V power supply is supplied unchanged to the ROM 12. This ensures that no large voltage difference is generated between the voltages of the address and control signals and the power supply voltage, which can prevent the occurrence of latch-up in an effective manner.

On the other hand, if the IC card is connected to a host system that is rated for 5 V, the power supply voltage is regulated by the regulated-voltage circuit 40 and is supplied to the internal power line 21. In this case, the voltage difference between the external connection line 20 and the internal connection line 21 can be sufficiently maintained. Therefore, even if the load current essential to the ROM 12 increases, the output voltage of the regulated-voltage circuit 140 can be held in a simple manner to within the recommended operating voltage range of the ROM 12 of 3.0 V to 3.6 V. From this point of comparison, this second embodiment is superior to a configuration without the analog switch 100, and providing regulated power supply voltage from the regulated-voltage circuit 140 alone. That is, if the circuit configuration is such that the power supply voltage is simply regulated as described above, there will be no problems when the power supply of the host system is 5 V, but when it is 3.3 V, the load current of the ROM 12 will make the power supply voltage of the internal power line 21 drop below 3.3 V.

Third Embodiment

Figure 5:
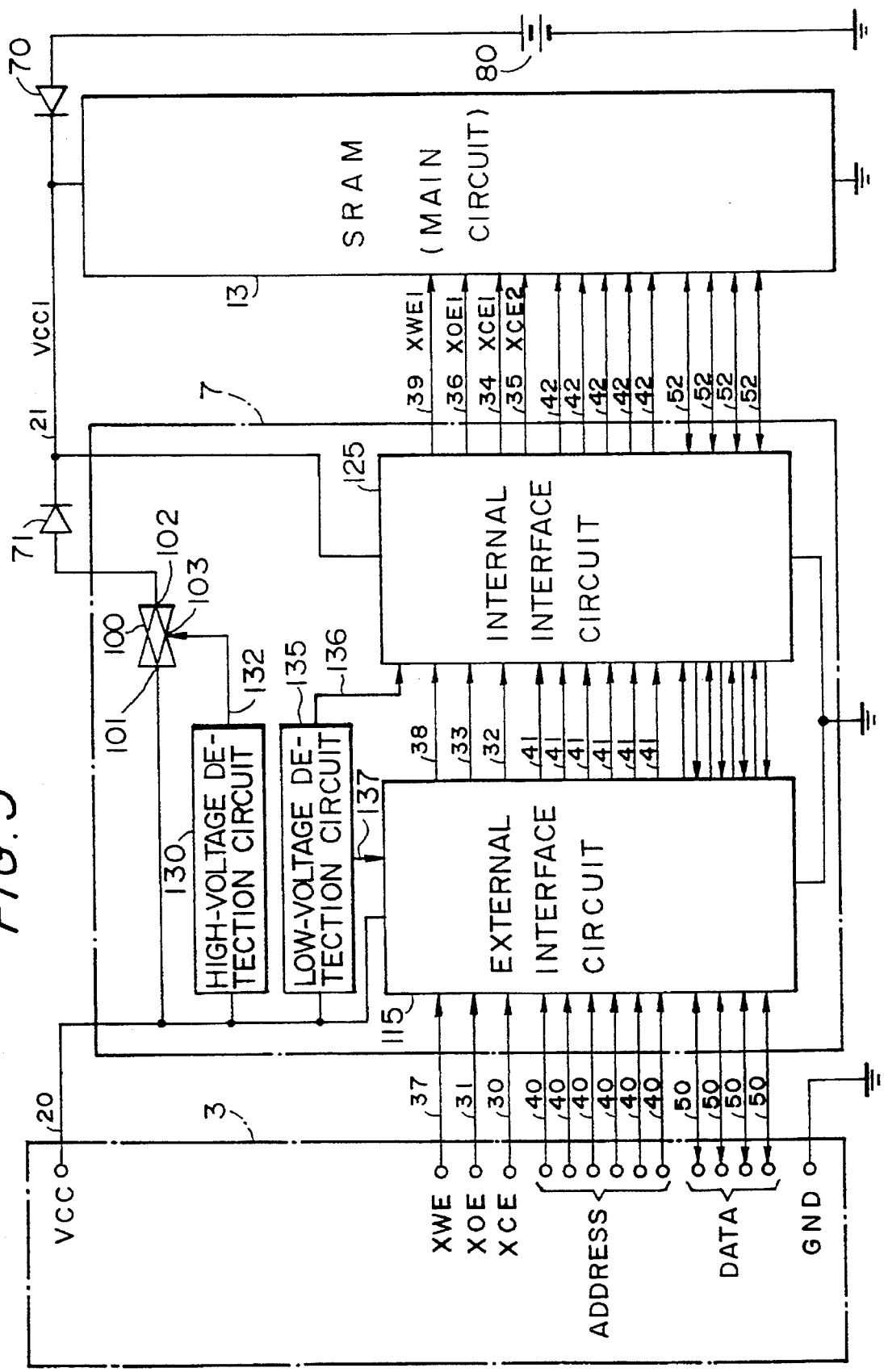
FIG. 5 is a block diagram of a third embodiment of the present invention.

A block diagram of an IC card relating to a third embodiment of the present invention is shown in FIG. 5. This third embodiment is similar to the previously described first embodiment, except that the main circuit is an SRAM 13.

An external interface circuit 115 and an internal interface circuit 125 of this third embodiment differ from the external interface circuit 110 and the internal interface circuit 120 of the first embodiment in that a circuit corresponding to a write enable signal XWE 37 and the like are added.

This embodiment is also provided with a built-in battery 80 and rectifying elements such as diodes 70 and 71 for preserving data when the power supply is interrupted. In this case, the diode 71 is provided to prevent backflow of the current of the built-in battery 80. Therefore, if, for example, the analog switch 100 has been placed in a conductive (ON) state, the power supply voltage of the internal power line 21 is supplied via the diode 71 which is a rectifying element.

In comparison with the first embodiment, this third embodiment is configured such that an interface circuit 7 also comprises a low-voltage detection circuit 135. This low-voltage detection circuit 135 detects drop in the voltage of the power supply Vcc immediately after the IC card is inserted into the host system, or when the IC card is removed from the host system, or if power to the host system fails while the memory card is inserted therein. In this case, if the recommended operating voltage of the IC card has a range of 3.3 V±0.3 V, the detection voltage could be, for example, about 2.7 V (hereinafter, this voltage is called the lower-limit voltage).

If the low-voltage detection circuit 135 determines that the voltage of the power supply Vcc is less than its lower-limit voltage of 2.7 V, it disables the operation of the SRAM that is the main circuit. In this case, the disabling of the operation of the main circuit is done by, for example, a control signal 136 of a control signal 137. For example, if the above operation-disabling is done by the control signal 136, the control signal 136 is output to the internal interface circuit 125, and memory control signals XCE1 and XCE2 and a write signal XWE1 are disabled. This puts the SRAM 13 in the operation-disabled state. If the above operation-disabling is done by the control signal 137, the control signal 137 is output to the external interface circuit 115, and the external interface circuit 115 sets a status such that no signals are received from a connector 3. More specifically, components such as NAND circuits that are connected to the inputs from the connector are provided in input terminals of the external interface circuit 115. A low-level signal is input to the NAND circuits based on the control signal 137. This ensures that the external interface circuit 115 is set to a status such that no signals are received from a connector 3.

Figure 6:
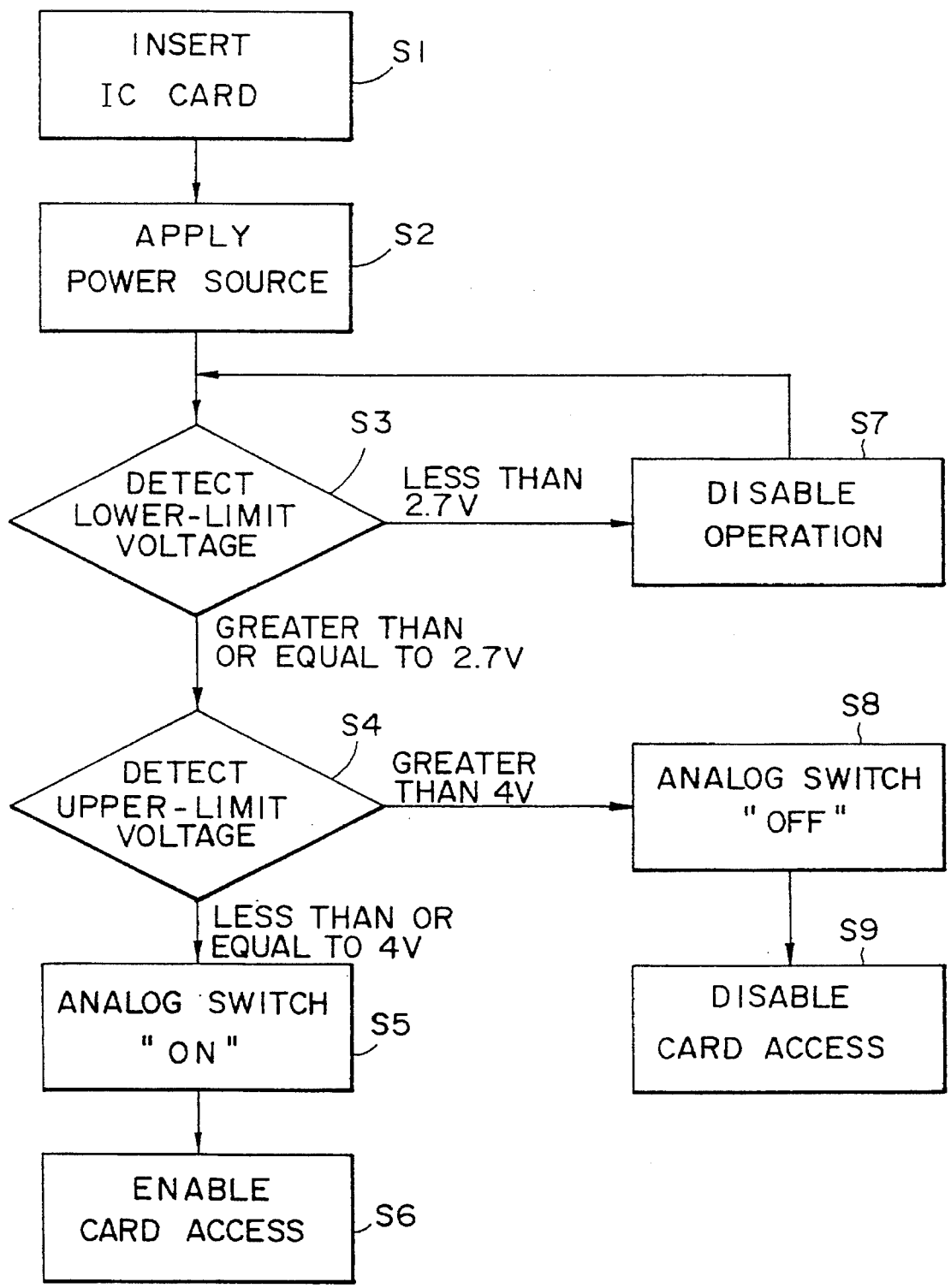
FIG. 6 is a flowchart of the process of detecting a low voltage with the third embodiment.

This operation of detecting the lower-limit voltage is intrinsic to this IC card. That is, this operation is one that must be done by a characteristic of the IC card that is subordinate to the power supply of the host system. A flowchart of the processing procedure of the IC card when it detects the lower-limit voltage in this manner is shown in FIG. 6. This procedure is briefly described below.

First, when the IC card is inserted into the host system in a step S1, power is applied to the IC card in a step S2, then the voltage of the power supply Vcc rises slowly. When this happens, the voltage of the power supply Vcc is detected by the low-voltage detection circuit 135 to determine whether or not it is less than the lower-limit voltage 2.7 V, as shown in a step S3. If the voltage of the power supply Vcc is determined to be less than 2.7 V, the operation of at least the main circuit is disabled in a step S7. Conversely, if the voltage of the power supply Vcc is determined to be greater than or equal to 2.7 V, the flow proceeds to detecting whether or not the voltage of the power supply Vcc is greater than the upper-limit voltage of 4 V by the high-voltage detection circuit 130, in a step S4. If the voltage of the power supply Vcc is determined to be greater than the upper-limit voltage 4 V, the analog switch 100 is placed in a non-conductive (OFF) state by the control signal 132 in a step S8. In this case, access to the IC card is then disabled in a step S9. If, however, the voltage of the power supply Vcc is determined to be less than or equal to the upper-limit voltage 4 V, the analog switch 100 is placed in a conductive (ON) state by the control signal 132 in a step S5. This enables access to the IC card in a step S6, so that data can be transferred between the host system and the IC card.

Fourth Embodiment

Figure 7:
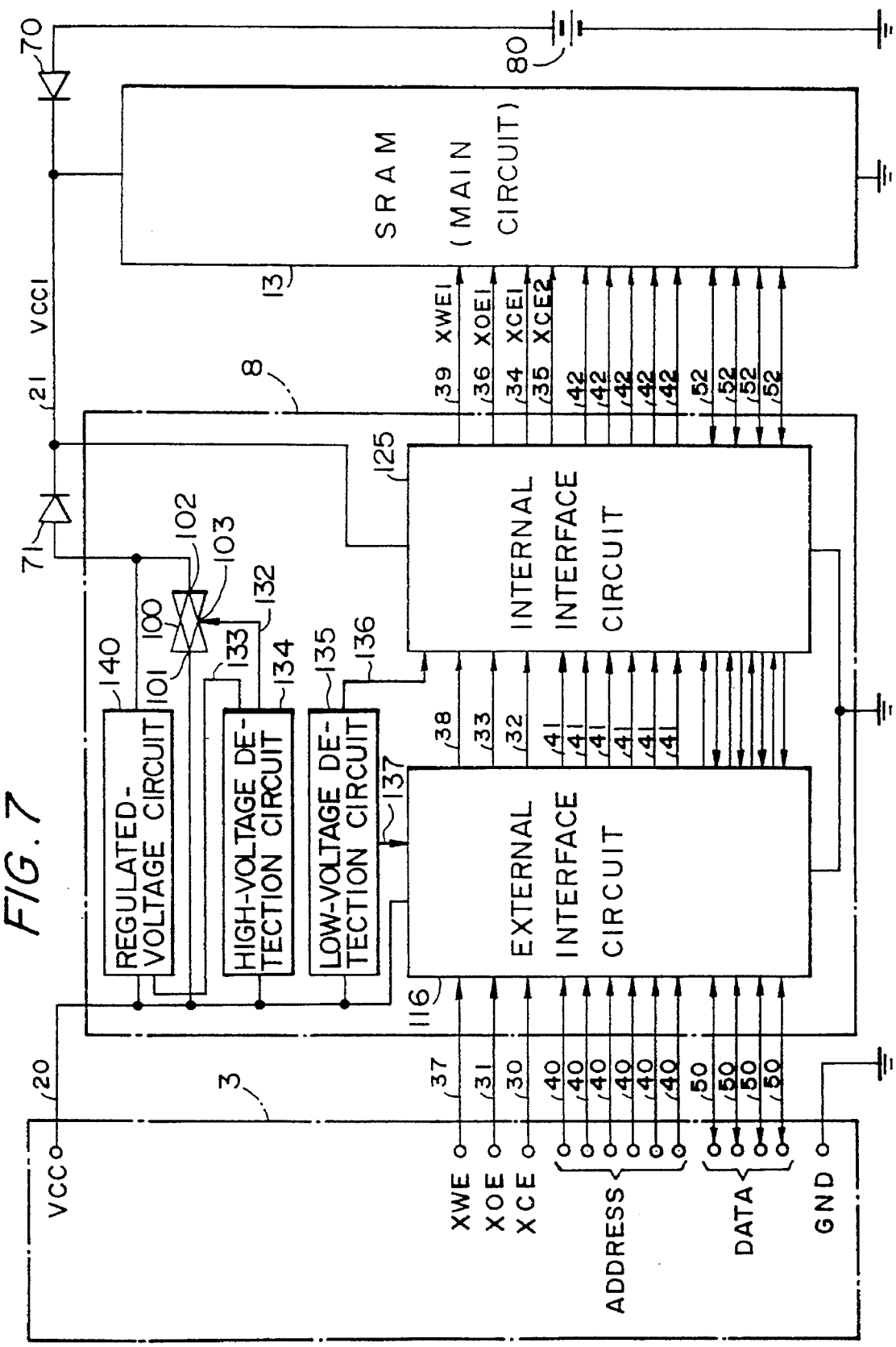
FIG. 7 is a block diagram of a fourth embodiment of the present invention.

A block diagram of an IC card relating to a fourth embodiment of the present invention is shown in FIG. 7. This fourth embodiment is similar to the previously described second embodiment, except that the main circuit is an SRAM 13.

Since differences in configuration and operation between the fourth embodiment and the second embodiment are the same as the differences in the configuration and operation between the third embodiment and the first embodiment, further description thereof is omitted below.

Figure 8:
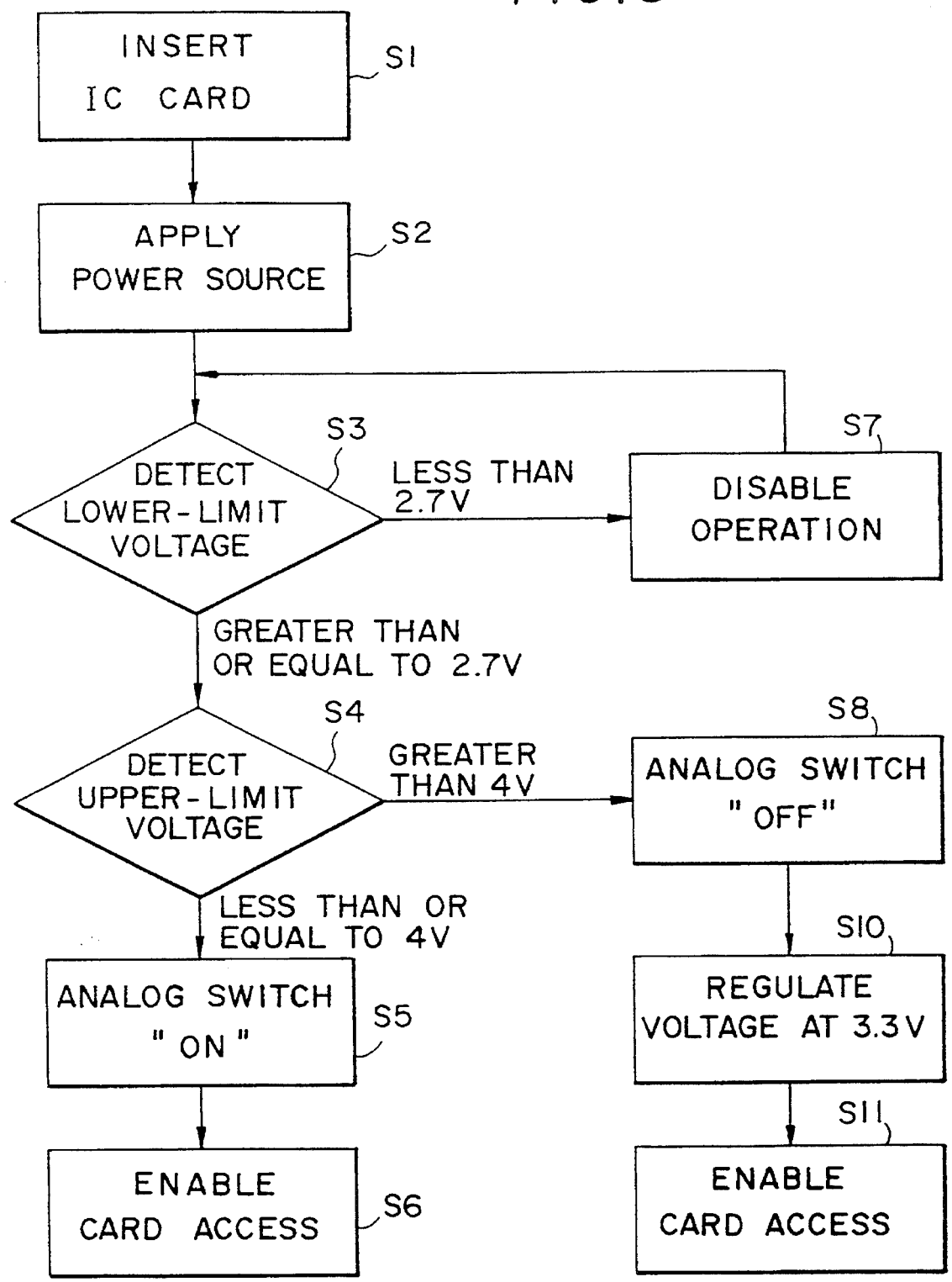
FIG. 8 is a flowchart of the process of detecting a low voltage with the fourth embodiment.

A flowchart of the processing procedure after the IC card of the fourth embodiment is inserted is shown in FIG. 8. The flowchart of FIG. 8 differs from that of FIG. 6 in having a step S10 and a step S11. That is, in this fourth embodiment, after the voltage of the power supply Vcc has been found to be greater than the upper-limit voltage 4 V and the analog switch 100 has been up in the non-conductive (OFF) state in step S8, the voltage of the power supply Vcc is regulated to 3.3 V by the regulated-voltage circuit 140 in step S10. Thereafter, this embodiment differs from the previously described third embodiment in that access to the IC card is enabled in step S11. This ensures that data can be exchanged between the host system and the IC card.

Fifth Embodiment

The fifth and sixth embodiments described below give examples of chip configurations of the interface circuit and the main circuit. In the description below, chip configurations of the third embodiment shown in FIG. 5 is used as an example, but these can naturally be applied in the same way to chip configurations for the first, second, and fourth embodiments.

In order to reduce power consumption and to reduce costs by reducing the number of components, it is preferable to configure the IC card in such a manner that the interface circuit, main circuit, and other circuits are on as few chips as possible. Particularly to make the size of the IC card small in order to make it easy to carry around, it is extremely important to have a configuration with small number of chips.

Figure 9A:
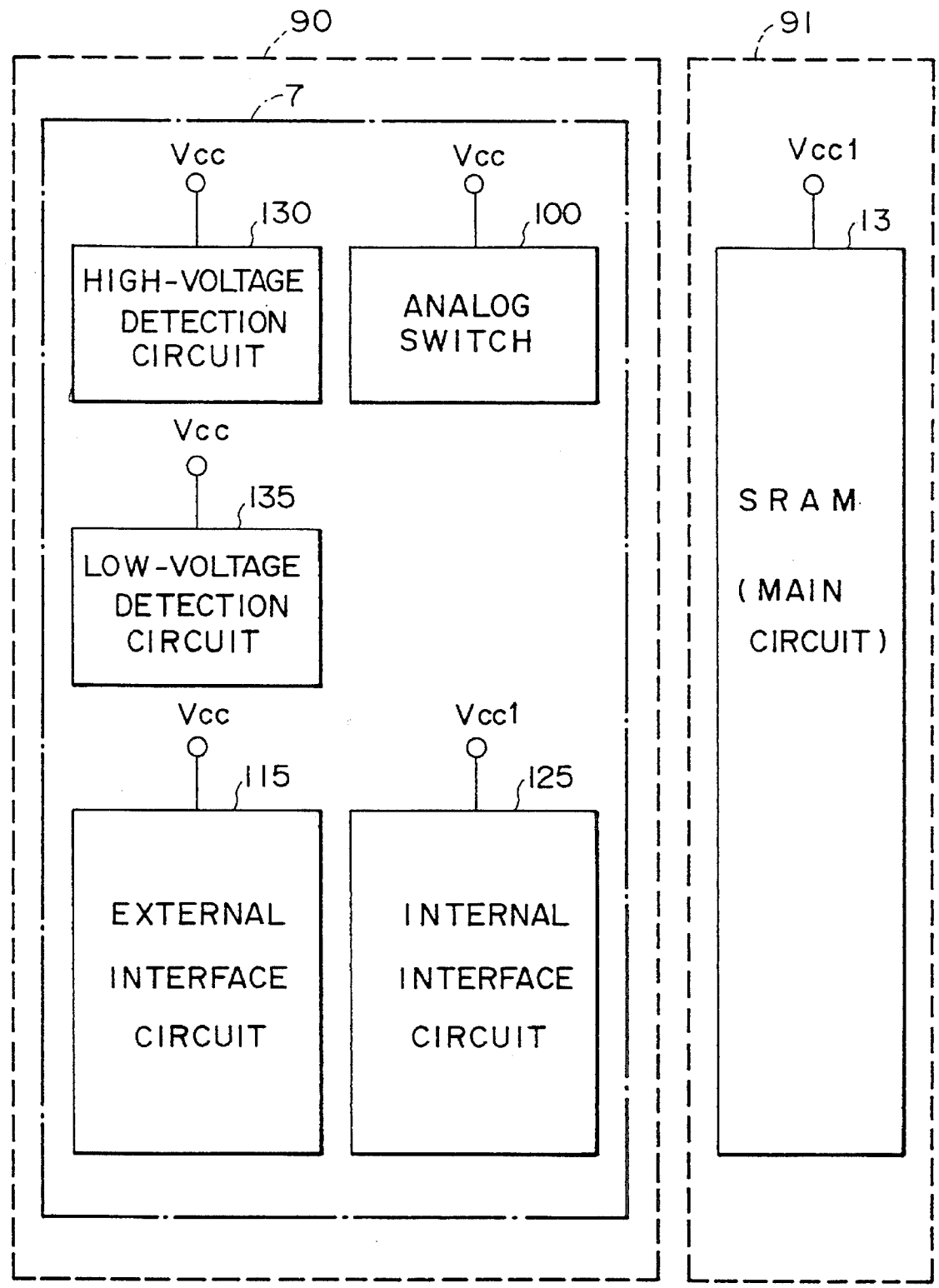
FIG. 9A is a schematic diagram used to illustrate a fifth embodiment of the present invention.

In the fifth embodiment shown in FIG. 9A, the IC card has a two-chip configuration of CMOS IC chips 90 and 91. In this case, the interface circuit 7 comprising the analog switch 100, external interface circuit 115, internal interface circuit 125, high-voltage detection circuit 130, and low-voltage detection circuit 135 is formed on the IC chip 90. In addition, the SRAM 13 that is the main circuit is formed on the IC chip 91.

When the IC card has a two-chip configuration such as that described above, the connection of signals between the interface circuit and the main circuit causes problems. That is, the power supply line of the interface circuit and that of the host system are made common, so that, when the card is inserted into a host system that is rated for 5 V, this power supply has a different voltage from the power supply of the main circuit. In this case, power is supplied to the main circuit through an input protection diode and a parasitic diode, and the objective of supplying power at less than the maximum rated voltage cannot be achieved. This is described in more detail with reference to FIG. 10.

Figure 10:
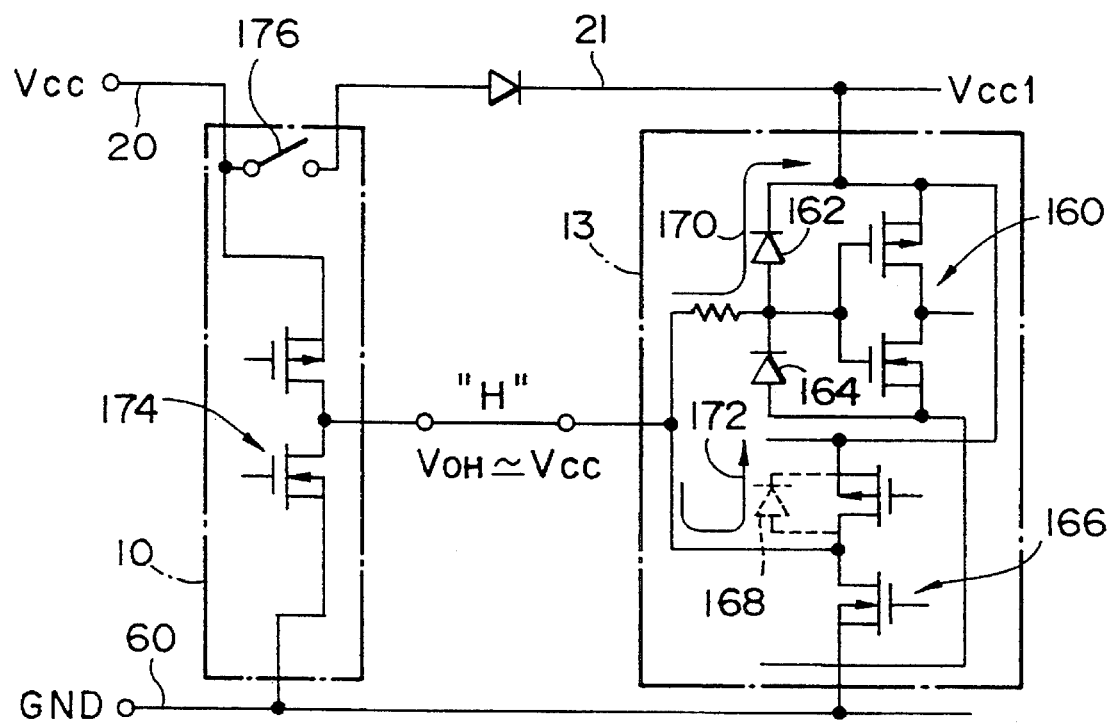
FIG. 10 is a schematic diagram used to illustrate the supply of power through an input protection diode and a parasitic diode.

An input circuit 160 of a CMOS IC is usually provided with diodes 162 and 164 between the input terminal and the power supply and between the input terminal and ground, to protect the circuitry from electrostatic discharge, as shown in FIG. 10. In addition, there exists a parasitic diode 168 in an output circuit 166, as also shown in FIG. 10. Assume that a switch 176 is provided in a prior art interface circuit 10 in such a manner that the link between the internal power line 20 and the external power line 21 can be connected and disconnected. If so, even if the switch 176 provided between the external power line 20 and the internal power line 21 is in a non-conductive (OFF) state, the situation described below can occur when the output terminal of the interface circuit 10 outputs a high-level signal. That is, a current 170 flows through the input protection diode 162 provided between the input terminal of the SRAM 13 that is the main circuit and the power supply. Thus a situation occurs in which the power supply Vcc1 of the SRAM 13 that is the main circuit is pulled up to the voltage of the power supply Vcc of the host system and the interface circuit 10. In addition, if the main circuit is such that data input and output are performed by the same terminals, as it is with 8-bit input-output SRAM or DRAM, for example, an output from an output circuit 174 of the interface circuit 10 is connected directly to outputs from input-output (I/O) circuits (only the output circuit 166 is shown in the figure) of the SRAM 13 that is the main circuit, as shown in FIG. 10. Therefore, a current 172 flows through the parasitic diode 168 formed between the substrate and the drain region of the p-channel MOSFET of the output circuit 166 of the SRAM 13. This causes a situation in which the power supply Vcc1 of the SRAM 13 is pulled up to the voltage of the power supply Vcc of the host system and the interface circuit 10. That is, when the IC card is inserted into a card slot rated for 5 V, a power supply at 5 V that exceeds the maximum rated voltage 4.6 V of the SRAM 13 that is the main circuit is applied thereto.

Figure 11:
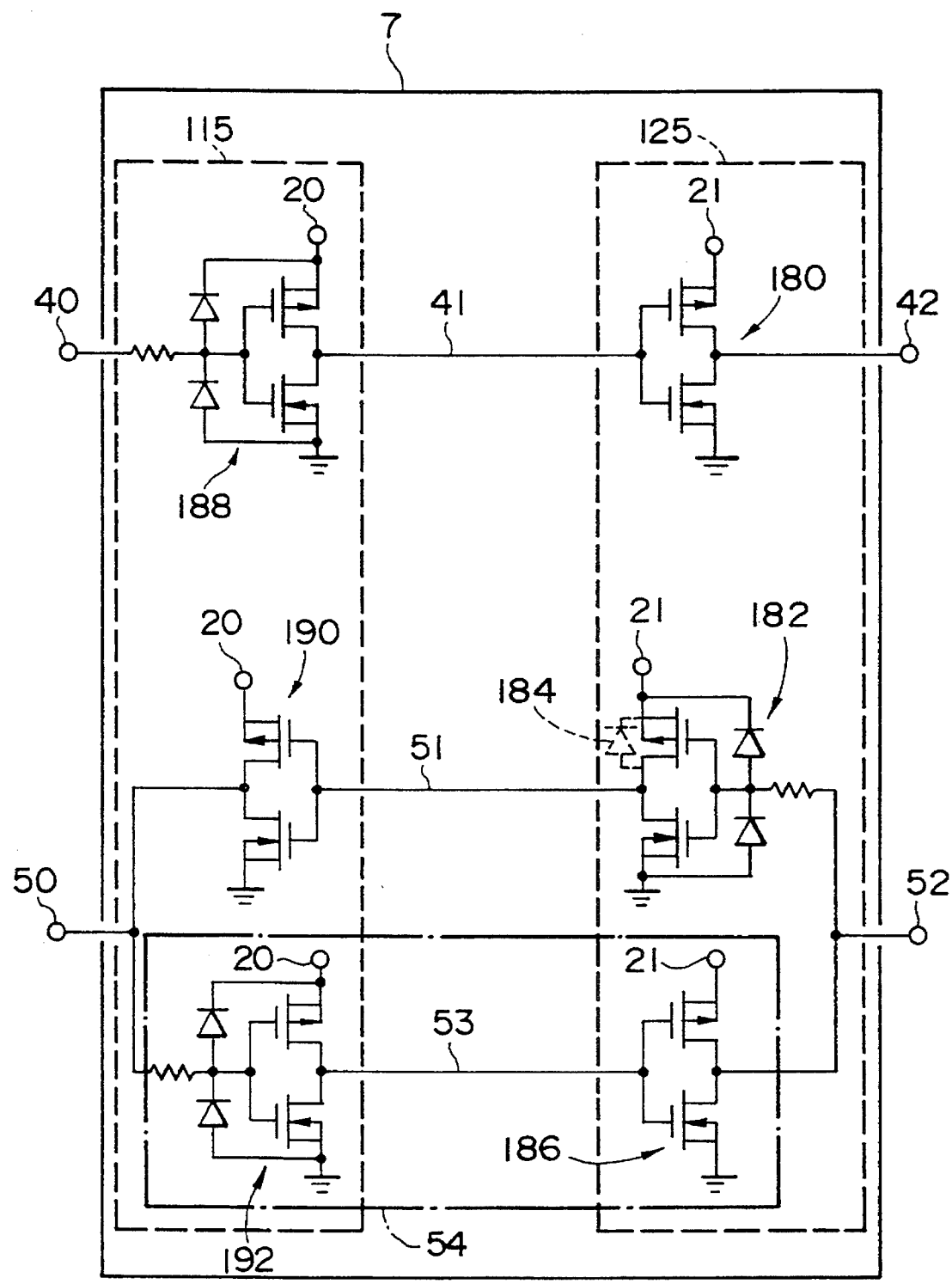
FIG. 11 is a schematic diagram of input circuits and input-output circuits included in the external interface circuit and the internal interface circuit.

In contrast, the interface circuit 5, 6, 7, 8, 9, or 11 of the present invention is provided with the internal interface circuit 120 or 125 to ensure that this situation does not occur. This will now be described using FIG. 11. In FIG. 11, input-output (I/O) circuits comprising an input circuit 192 and an output circuit 190, and an output circuit 188 within the external interface circuit 115, are shown in an idealized form. In the same manner, input-output (I/O) circuits comprising an output circuit 182 and an input circuit 186, and an input circuit 180 within the internal interface circuit 125, are shown in an idealized form. Note that signals 40 and 50 provide connections between the external interface circuit 115 and the connector, and signals 42 and 52 provide connections between the internal interface circuit 125 and the SRAM 13 that is the main circuit.

The external interface circuit 115 and the internal interface circuit 125 are comprised within the interface circuit 7, and these external and internal interface circuits 115 and 125 are formed of a one-chip configuration CMOS IC, as shown in FIG. 9A. Since the external interface circuit 115 and the internal interface circuit 125 have a one-chip configuration, there is no danger that intermediate signals 41, 51, and 53 between the external interface circuit 115 and the internal interface circuit 125 will be affected by electrostatic discharge from outside the chip. Therefore, there is no need to provide any input protection diode in the input circuits 180, 186, and 190 that these intermediate signals 41, 51, and 53 are connected to. Therefore, if, for example, the intermediate signal 41 goes high, since the input circuit 180 of FIG. 11 differs from the input circuit 160 of FIG. 10 in that no input protection diode, the voltage of the internal power line 21 is no longer pulled up.

In addition, the input-output (I/O) circuits (182, 186) of FIG. 11 differ from the input-output (I/O) circuits (160, 166) of FIG. 10 in that the intermediate signals are divided into an input-purpose signal 53 and an output-purpose signal 51. Therefore, the output from the external interface circuit 125 is not connected to the output point of the internal interface circuit 115. As a result, even when the intermediate signal 53 goes high, no current flows through a parasitic diode 184 formed between the substrate and the drain region of the p-channel MOSFET of the output circuit 182. Therefore, there is no longer any danger that the voltage of the internal power line 21 will be pulled up. With the fifth embodiment configured in this way, the provision of the internal interface circuit 115 ensures that the power supply voltage of the internal power line 21 is prevented from being pulled up by the signal lines.

Note that, as should be clear from FIG. 9A, if the interface circuit 7 has a one-chip configuration, the IC chip 90 must be configured as a dual power supply IC chip. If such a dual power supply IC chip is configured, a well to which each power supply is connected must be electrically isolated. For example, p-type silicon is used for the substrate of the IC chip 90, and one or a plurality of n-type wells are provided to be connected to the different power supplies. That is, the internal power line 21, that is the common power line of the SRAM 13, is connected to n-type wells provided for the use of the internal interface circuit 125. Similarly, the external power line 20 is connected to an n-type well provided for the use of circuits other than the internal interface circuit 125. This ensures that the supply of power between the external power line 20 and the internal power line 21 to be isolated. In this case, an n-type well is formed by comparatively deep diffusion of an impurity such as phosphorus into the surface of a p-type silicon substrate, to form a region that becomes the substrate of a CMOS p-channel MOSFET. For example, in the case shown in FIG. 9A, among the circuits comprising the interface circuit 7, n-type wells provided for the use of the analog switch 100, the external interface circuit 115, the high-voltage detection circuit 130, and the low-voltage detection circuit 135 are connected to the external power line 20. On the other hand, an n-type well provided for the use of the internal interface circuit 125 is connected to the internal power line 21 that is the common power line of the SRAM 13.

Figure 12:
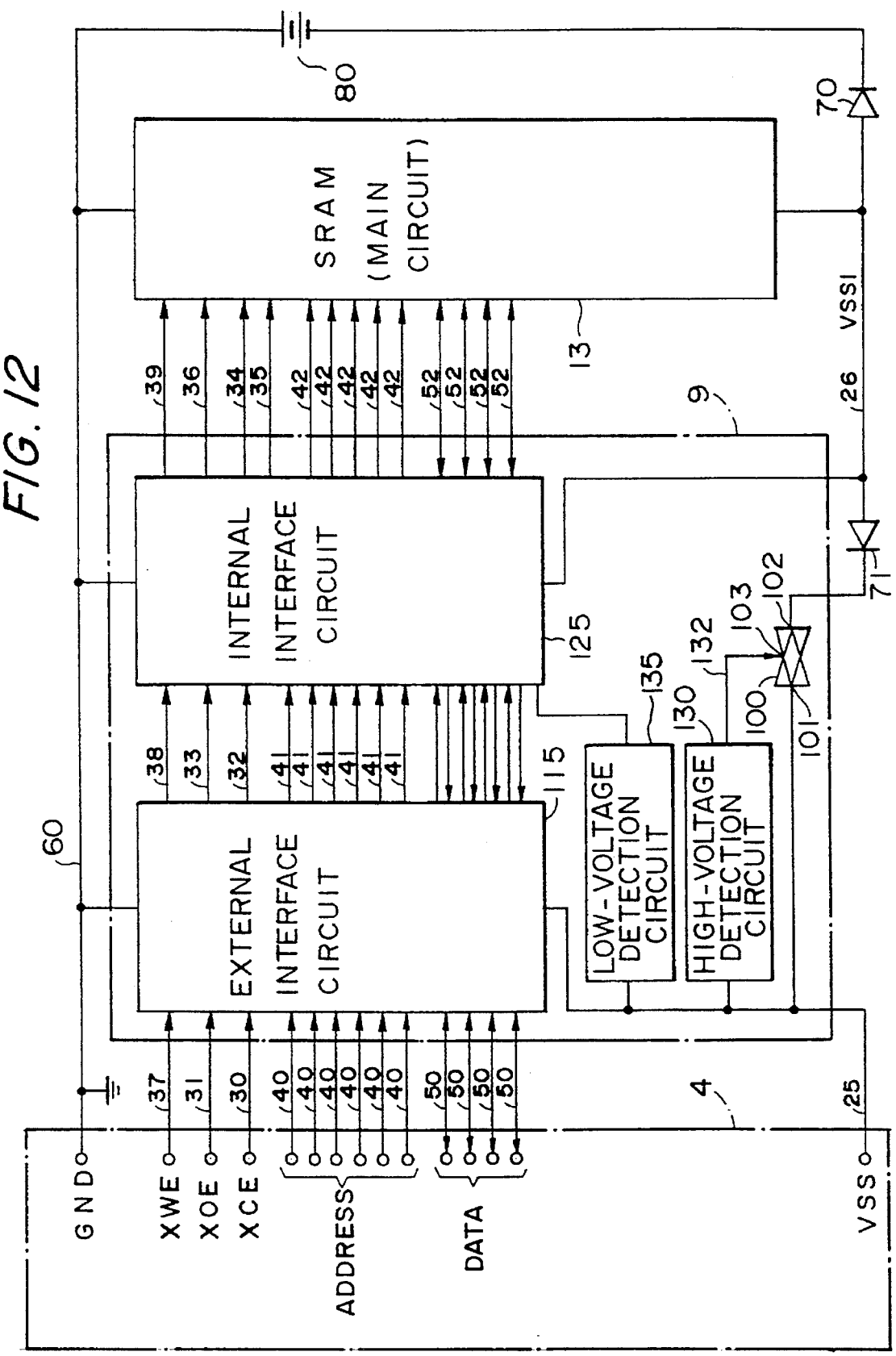
FIG. 12 is a block diagram of a case in which the power supply voltage is a negative voltage and the IC chip has a configuration such that a p-type well is provided on an n-type substrate.

Note that, in the embodiments shown in FIGS. 1, 2, 5, and 7, and GND power supply acts as a common reference power supply for all the circuits, and the positive power supply Vcc is divided to provided individual power supplied for the circuits of the external power line 20 and the internal power line 21. Therefore, in this case, the power supply of the substrate is GND, and the wells are connected to the positive power supply Vcc. This makes the substrate p-type and the wells n-type. However, it should be obvious that the present invention is not limited to this configuration; it can have the circuit configuration shown in FIG. 12. That is, in FIG. 12, the GND power supply forms a reference power supply, and a negative power supply Vss is divided for an external power line 25 and an internal power line 26. Therefore, the substrate connected to the GND power supply is n-type in this case, and the wells connected to the negative power supply are p-type. The p-type wells that are connected to the external power line 25 are electrically separated from the p-type wells that are connected to the internal power line 26. In this case, if the high-voltage detection circuit 130 determines that the absolute value of the voltage of the power supply Vss of the host system is less than or equal to the absolute value of a prescribed voltage (for example, an upper-limit voltage of –4 V), the analog switch 100 is controlled to be in a conductive (ON) state. Conversely, if the absolute value of the voltage of the power supply Vss of the host system is determined to be greater that the absolute value of the prescribed voltage (–4 V), the analog switch 100 is controlled to be in a non-conductive (OFF) state. The low-voltage detection circuit 135 operates in a similar manner.

Figure 13:
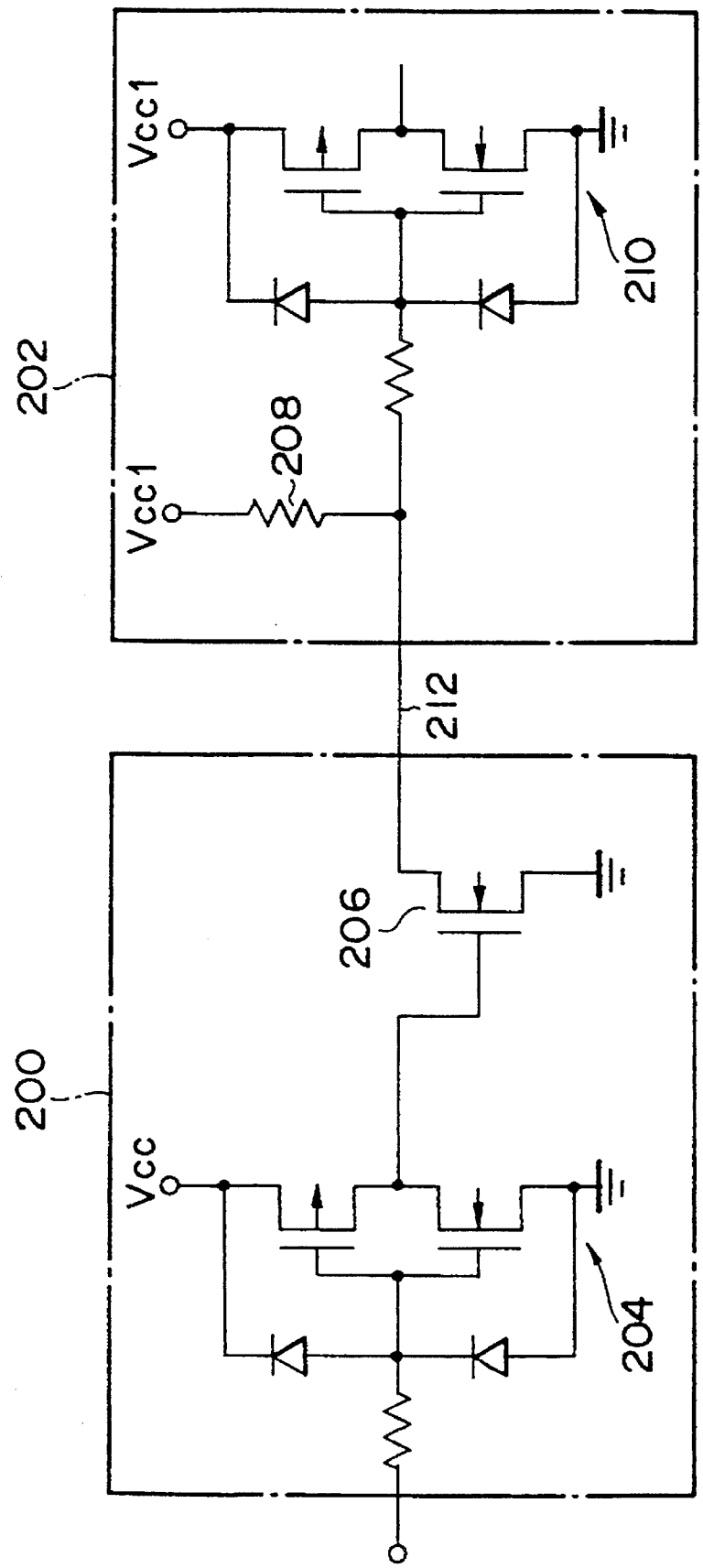
FIG. 13 is a schematic diagram used to illustrate a method of ensuring that leakage through the signal lines does not occur when IC chips of differing power supplies are connected.

Note that various different methods have been considered as ways of preventing any change in the power supply via protection and parasitic diodes when an IC chip of a differing power supply is connected, and these methods are not limited to the above described method of providing an internal interface circuit and isolating wells. For example, IC chips 200 and 202 shown in FIG. 13 differ in that they have different power supplies Vcc and Vcc1. In this case, an n-channel MOSFET 206 is provided on the IC chip 200 in such a manner that a gate electrode thereof is connected to an output of an input circuit 204, the source region is connected to a reference power supply GND, and the drain region is connected to an output signal 212 to the IC chip 202. These connections ensure that when the n-channel MOSFET 206 is in an on state, the output signal 212 is at GND level. On the other hand, when the n-channel MOSFET 206 is in an off state, the output signal 212 is pulled up by a resistor 208 and is set to the voltage of the power supply Vcc1. If this method of FIG. 13 is used, leakage of the power supply through the signal lines can be prevented in an effective manner, even when IC chips 200 and 202 of different power supplies are connected. Note that a bipolar transistor could be used in place of the n-channel MOSFET 206 in this case.

Sixth Embodiment

In the sixth embodiment shown in FIG. 9B, the IC card has a one-chip configuration of a CMOS IC chip 92. In order to reduce power consumption and to reduce costs by reducing the number of components, it is most preferable to configure the SRAM 13 that is the main circuit and the interface circuit 11 as a single chip. This would be particularly effective in an IC card which incorporates a single chip and which is used in such areas as the medical applications as previously described. One method of implementing a one-chip configuration is to increase the channel lengths and thickness of the gate oxide layers in the interface circuit 7 in comparison with the equivalents in the SRAM 13 to locally raise the maximum rated voltage to 5 V or more. Japanese Patent Application No. Hei4-298757 discloses a method of implementing an interface circuit for a 5 V IC on an IC that has an operating voltage of 3.3 V, without modifying the fabrication process. If an interface circuit is created by using this method, a one-chip configuration can be implemented without incurring any increase in costs due to modifications of the fabrication process. Whichever method is used to implement the one-chip configuration, the internal interface circuit can be omitted, as shown in FIG. 9B. In addition, in the same manner as described above with the fifth embodiment, the signal lines between the external interface circuit 115 and the SRAM 13 must not be bi-directional, and must be separated into input and output signal lines.

Note that the present invention is not limited to the above described embodiments, various other embodiments thereof can be envisioned within the range of the present invention as laid out herein.

For example, the present invention is not limited to IC cards in which the main circuit is ROM or SRAM, as described with reference to the first to sixth embodiments; it can be applied to all types of IC card. For example, the present invention could equally well be applied to a memory card in which the main circuit is dynamic random-access memory (DRAM). In this case, minor changes can be made, such as replacing the Chip Enable (XCE) signal of FIGS. 1 and 2 with a Row Address Strobe (XRAS) signal and a Column Address Strobe (XCAS) signal, adding a write Enable (XWE) signal, and making the data signal lines bi-directional. In addition, the present invention can naturally be applied to an IC card in which the main circuit is an EPROM, OTPROM, EEPROM, flash EEPROM, or a mixture of these types of memory. The present invention can also be applied to an IC card wherein the main circuit is a microprocessor and memory, in other words, an ISO standard IC card. Further, the main circuit could be circuitry having modem, LAN, or Ethernet functions.

The present invention can also be applied to an IC card comprising analog circuitry wherein the main circuit requires two power supplies that are positive and negative. For example, circuits relating to the power supply, such as the high-voltage detection circuit, analog switch, and regulated-voltage circuit could be configured in a similar manner to digital circuits. The circuit configuration could also be such that an external interface circuit, an internal interface circuit, and circuit elements or blocks, that converts an analog ground and analog signals, are selected corresponding to the power supply voltage of the host system. If the circuitry is configured in this manner, the present invention could be applied to an IC card wherein the main circuit comprises analog circuits for two power supplies, positive and negative.

In addition, the present invention is not limited to the one- and two-chip configurations shown in the fifth and sixth embodiments; it can be implemented with a configuration wherein all or some of the components such as the high-voltage detection circuit, the low-voltage detection circuit, the analog switch, and the regulated-voltage circuit could be on a number of chips, using existing products. In such a case, as should be clear from the descriptions of the above embodiments, there is no need to provide an input protection diode between an input terminal of the internal interface circuit and the power supply, and the signal lines between the external interface circuit and the internal interface circuit must not be bi-directional; they must be separated into input and output lines.

What is claimed is:

1. An IC card comprising a main circuit, a connector for connecting said IC card to a host system, and an interface circuit provided between said connector and said main circuit, wherein:

said interface circuit comprises:

an external interface circuit for connecting said host system to an internal interface circuit, a power supply line of the external interface circuit being connected to a first power supply line that is a power supply line from said host system;

said internal interface circuit for connecting said external interface circuit to said main circuit, a power supply line of the internal interface circuit being connected to a second power supply line that is a power supply line of said main circuit;

voltage detecting means for detecting a voltage of said first power supply line;

switching means for selectively connecting and disconnecting said first power supply line and said second power supply line based on a detection result of said voltage detection means, said switching means connecting said first power supply line to said second power supply line when an absolute value of said voltage of said first power supply line is less than an absolute value of a prescribed voltage, said switching means disconnecting said first power supply line from said second power supply line when said absolute value of said voltage of said first power supply line is at least said absolute value of said prescribed voltage.

2. The IC card according to claim 1 wherein:

said interface circuit further comprises a regulated-voltage circuit, said regulated-voltage circuit receiving the voltage of said first power supply line and outputting a regulated-voltage, said regulated-voltage provided to said second power supply line when said first power supply line is disconnected from said second power supply line.

3. The IC card according to claim 1 wherein:

said switching means comprises a CMOS transfer gate having a first terminal, a second terminal, and a gate electrode, said first terminal being connected to said first power supply line and said second terminal being connected to said second power supply line, said switching means placing the CMOS transfer gate in one of a conductive state and a non-conductive state by controlling said gate electrode based on a detection results of said voltage detection means.

4. The IC card according to claim 2 wherein:

said switching means comprises a CMOS transfer gate having a first terminal, a second terminal, and a gate electrode, said first terminal being connected to said first power supply line, said second terminal being connected to said second power supply line, and said switching means placing the CMOS transfer gate in one of a conductive state and a non-conductive state by controlling said gate electrode based on a detection results of said voltage detection means.

5. The IC card according to claim 1 wherein:

said prescribed voltage is set to an upper-limit voltage that is between at most the maximum rated voltage of said main circuit and at least the operating voltage of said main circuit.

6. The IC card according to claim 2 wherein:

said prescribed voltage is set to an upper-limit voltage that is between at most the maximum rated voltage of said main circuit and at least the operating voltage of said main circuit.

7. The IC card according to claim 3 wherein:

said prescribed voltage is set to an upper-limit voltage that is between at most the maximum rated voltage of said main circuit and at least the operating voltage of said main circuit.

8. The IC card according to claim 4 wherein:

said prescribed voltage is set to an upper-limit voltage that is between at most the maximum rated voltage of said main circuit and at least the operating voltage of said main circuit.

9. The IC card according to claim 5 wherein:

said voltage detection means comprises:

high-voltage detection means, for detecting said voltage of said first power supply line, said high-voltage detection means causing said switching means to connect said first power supply line to said second power supply line when the absolute value of said voltage of said first power supply line is at most an absolute value of said upper-limit voltage, said high-voltage detection means causing said switching means to disconnect said first power supply line from said second power supply line when the absolute value of said voltage of said first power supply line is greater than said absolute value of said upper-limit voltage; and low-voltage detection means for disabling said main circuit when the absolute value of said voltage of said first power supply is at most the absolute value of a lower-limit voltage, the lower-limit voltage guaranteeing a lower-limit operation of said main circuit.

10. The IC card according to claim 6 wherein:

said voltage detection means comprises:

high-voltage detection means, for detecting said voltage of said first power supply line, said high-voltage detection means causing said switching means to connect said first power supply line to said second power supply line when the absolute value of said voltage of said first power supply line is at most an absolute value of said upper-limit voltage, said high-voltage detection means causing said switching means to disconnect said first power supply line from said second power supply line when the absolute value of said voltage of said first power supply line is greater than said absolute value of said upper-limit voltage; and low-voltage detection means for disabling said main circuit when the absolute value of said voltage of said first power supply is at most the absolute value of a lower-limit voltage, the lower-limit voltage guaranteeing a lower-limit operation of said main circuit.

11. The IC card according to claim 7 wherein:

said voltage detection means comprises:

high-voltage detection means, for detecting said voltage of said first power supply line, said high-voltage detection means causing said switching means to connect said first power supply line to said second power supply line when the absolute value of said voltage of said first power supply line is at most an absolute value of said upper-limit voltage, said high-voltage detection means causing said switching means to disconnect said first power supply line from said second power supply line when the absolute value of said voltage of said first power supply line is greater than said absolute value of said upper-limit voltage; and low-voltage detection means for disabling said main circuit when the absolute value of said voltage of said first power supply is at most the absolute value of a lower-limit voltage, the lower-limit voltage guaranteeing a lower-limit operation of said main circuit.

12. The IC card according to claim 8 wherein:

said voltage detection means comprises:

high-voltage detection means, for detecting said voltage of said first power supply line, said high-voltage detection means causing said switching means to connect said first power supply line to said second power supply line when the absolute value of said voltage of said first power supply line is at most an absolute value of said upper-limit voltage, said high-voltage detection means causing said switching means to disconnect said first power supply line from said second power supply line when the absolute value of said voltage of said first power supply line is greater than said absolute value of said upper-limit voltage; and low-voltage detection means for disabling said main circuit when the absolute value of said voltage of said first power supply is at most the absolute value of a lower-limit voltage, the lower-limit voltage guaranteeing a lower-limit operation of said main circuit.

13. The IC card according to claim 1 wherein:

said interface circuit is formed on a signal CMOS chip, said CMOS chip comprising at least one first well provided for at least said external interface circuit, said switching means and said voltage detecting means, and at least one second well provided for said internal interface circuit, said first power supply line being connected to said at least one first well, said second power supply line being connected to said at least one second well, and said at least one first well being electrically separated from said at least one second well.

14. The IC card according to claim 2 wherein:

said interface circuit is formed on a signal CMOS chip, said CMOS chip comprising at least one first well provided for at least said external interface circuit, said switching means and said voltage detecting means, and at least one second well provided for said internal interface circuit, said first power supply line being connected to said at least one first well, said second power supply line being connected to said at least one second well, and said at least one first well being electrically separated from said at least one second well.

15. The IC card according to claim 3 wherein:

said interface circuit is formed on a signal CMOS chip, said CMOS chip comprising at least one first well provided for at least said external interface circuit, said switching means and said voltage detecting means, and at least one second well provided for said internal interface circuit, said first power supply line being connected to said at least one first well, said second power supply line being connected to said at least one second well, and said at least one first well being electrically separated from said at least one second well.

16. The IC card according to claim 4 wherein:

said interface circuit is formed on a signal CMOS chip, said CMOS chip comprising at least one first well provided for at least said external interface circuit, said switching means and said voltage detecting means, and at least one second well provided for said internal interface circuit, said first power supply line being connected to said at least one first well, said second power supply line being connected to said at least one second well, and said at least one first well being electrically separated from said at least one second well.

17. The IC card according to claim 1 wherein:

said interface circuit is formed on a signal CMOS chip, and said internal interface circuit are driver transistors, wherein gate electrodes of said driver transistors are connected to signal terminals of said external interface circuit, source regions of said driver transistors are connected to a reference power supply of a substrate of said CMOS chip, and drain regions of said driver transistors are connected to signal terminals of said main circuit and to said second power supply line via a resistive element.

18. The IC card according to claim 2 wherein:

said interface circuit is formed on a signal CMOS chip, and said internal interface circuit are driver transistors, wherein gate electrodes of said driver transistors are connected to signal terminals of said external interface circuit, source regions of said driver transistors are connected to a reference power supply of a substrate of said CMOS chip, and drain regions of said driver transistors are connected to signal terminals of said main circuit and to said second power supply line via a resistive element.

19. The IC card according to claim 3 wherein:

said interface circuit is formed on a signal CMOS chip, and said internal interface circuit are driver transistors, wherein gate electrodes of said driver transistors are connected to signal terminals of said external interface circuit, source regions of said driver transistors are connected to a reference power supply of a substrate of said CMOS chip, and drain regions of said driver transistors are connected to signal terminals of said main circuit and to said second power supply line via a resistive element.

20. The IC card according to claim 4 wherein:

said interface circuit is formed on a signal CMOS chip, and said internal interface circuit are driver transistors, wherein gate electrodes of said driver transistors are connected to signal terminals of said external interface circuit, source regions of said driver transistors are connected to a reference power supply of a substrate of said CMOS chip, and drain regions of said driver transistors are connected to signal terminals of said main circuit and to said second power supply line via a resistive element.

21. The IC card according to claim 1, wherein the first power supply line is connected to the second power supply line via a rectifying element.

22. The IC card according to claim 2, wherein the first power supply line is connected to the second power supply line via a rectifying element.

23. The IC card according to claim 3, wherein the first power supply line is connected to the second power supply line via a rectifying element.

24. The IC card according to claim 4, wherein the first power supply line is connected to the second power supply line via a rectifying element.

25. An IC card comprising a main circuit, a connector for connecting said IC card to a host system, and an interface circuit provided between said connector and said main circuit, wherein said interface circuit comprises:

an external interface circuit for connecting said host system to said main circuit;

voltage detection means for detecting a voltage of a first power supply line that is a power supply line from said host system;

switching means for selectively connecting and disconnecting said first power supply line and a second power supply line based on a detection result of said voltage detection means, said second power supply line being a power supply line of said main circuit, said switching means connecting said first power supply line and said second power supply line when an absolute value of said voltage of said first power supply line is less than an absolute value of a prescribed voltage, said switching means disconnecting said first power supply line from said second power supply line when said absolute value of said voltage of said first power supply line is at least said absolute value of said prescribed voltage.

26. The IC card according to claim 25 wherein:

said interface circuit further comprises a regulated-voltage circuit, said regulated-voltage circuit receiving the voltage of said first power supply line and outputting a regulated-voltage, said regulated-voltage provided to said second power supply line when said first power supply line is disconnected from said second power supply line.

27. The IC card according to claim 25 wherein:

said switching means comprises a CMOS transfer gate having a first terminal, a second terminal, and a gate electrode, said first terminal being connected to said first power supply line and said second terminal being connected to said second power supply line, said switching means placing the CMOS transfer gate in one of a conductive state and a non-conductive state by controlling said gate electrode based on a detection result of said voltage detection means.

28. The IC card according to claim 26 wherein:

said switching means comprises a CMOS transfer gate having a first terminal, a second terminal, and a gate electrode, said first terminal being connected to said first power supply line said second terminal being connected to said second power supply line, and said switching means placing the CMOS transfer gate in one of a conductive state and a non-conductive state by controlling said gate electrode based on a detection result of said voltage detection means.

29. The IC card according to claim 25 wherein:

said interface circuit and said main circuit are formed on a signal CMOS chip, said CMOS chip comprising:

at least one first well provided for said interface circuit; and at least one second well provided for said main circuit, said first power supply line being connected to said at least one first well, said second power supply line being connected to said at least one second well, and said at least one first well being electrically separated from said at least one second well.

30. The IC card according to claim 25, wherein the first power supply line is connected to the second power supply line via a rectifying element.

31. The IC card according to claim 27 wherein:

said interface circuit and said main circuit are formed on a signal CMOS chip, said CMOS chip comprising:

at least one first well provided for said interface circuit and at least one second well provided for said main circuit, said first power supply line being connected to said at least one first well, said second power supply line being connected to said at least one second well, and said at least one first well being electrically separated from said at least one second well.

32. The IC card according to claim 27, wherein the first power supply line is connected to the second power supply line via a rectifying element.

33. The IC card according to claim 26 wherein:

said interface circuit and said main circuit are formed on a signal CMOS chip, said CMOS chip comprising:

at least one first well provided for said interface circuit; and at least one second well provided for said main circuit, said first power supply line being connected to said at least one first well, said second power supply line being connected to said at least one second well, and said at least one first well being electrically separated from said at least one second well.

34. The IC card according to claim 27, wherein the first power supply line is connected to the second power supply line via a rectifying element.

35. The IC card according to claim 28 wherein:

said interface circuit and said main circuit are formed on a signal CMOS chip, said CMOS chip comprising:

at least one first well provided for said interface circuit and at least one second well provided for said main circuit, said first power supply line being connected to said at least one first well, said second power supply line being connected to said at least one second well, and said at least one first well being electrically separated from said at least one second well.

36. The IC card according to claim 28, wherein the first power supply line is connected to the second power supply line via a rectifying element.

* * * * *